United States Patent [19]
Munezane et al.

[11] Patent Number: 6,000,123
[45] Date of Patent: Dec. 14, 1999

[54] ELECTRONIC-PARTS MOUNTING APPARATUS

[75] Inventors: Takashi Munezane, Osaka; Takatoshi Mitsushima, Nara; Noboru Furuta, Osaka; Kimio Iizuka, Osaka; Kunio Tanaka, Osaka; Tomitatsu Soga, Osaka, all of Japan

[73] Assignee: Matsushita Electric Industrial Co., Ltd., Osaka, Japan

[21] Appl. No.: 08/961,921

[22] Filed: Oct. 31, 1997

[30] Foreign Application Priority Data

Jan. 17, 1997 [JP] Japan ................................. 9-006015

[51] Int. Cl.⁶ .......................................... H05K 3/30
[52] U.S. Cl. ................................. 29/740; 29/739; 29/721
[58] Field of Search ........................ 29/739, 740, 721, 29/840; 198/341

[56] References Cited

U.S. PATENT DOCUMENTS

| | | | |
|---|---|---|---|
| 4,881,319 | 11/1989 | Yagi et al. | 29/840 |
| 5,060,366 | 10/1991 | Asai et al. | 29/739 |
| 5,223,528 | 6/1993 | Hammer et al. | |
| 5,323,528 | 6/1994 | Baker | 29/721 |
| 5,383,270 | 1/1995 | Iwatsuka et al. | 29/840 |
| 5,437,359 | 8/1995 | Maruyama et al. | 198/341 |
| 5,500,997 | 3/1996 | Kobayashi et al. | 29/740 |

FOREIGN PATENT DOCUMENTS

| | | |
|---|---|---|
| 0449481 | 10/1991 | European Pat. Off. . |
| 0701394 | 3/1996 | European Pat. Off. . |
| 4-177898 | 6/1992 | Japan ................................. 29/739 |
| 601603-A1 | 6/1994 | Japan ................................. 29/739 |
| 09181489 | 7/1997 | Japan ............................. H05K 13/04 |

Primary Examiner—Lee Young
Assistant Examiner—Rick Kiltae Chang
Attorney, Agent, or Firm—Pollock, Vande Sande & Amernick

[57] ABSTRACT

Cassettes contain electronic parts. First and second feeders are operative for feeding the electronic parts from the cassettes. A first mounting head has sucking nozzles for picking up the electronic parts fed by the first feeder. A second mounting head has sucking nozzles for picking up the electronic parts fed by the second feeder. A table arrangement is operative for holding a printed circuit board. The first and second mounting heads are alternately moved along a first direction to a region above the printed circuit board on the table arrangement. The table arrangement includes a mechanism for moving the printed circuit board on the table arrangement in a second direction perpendicular to the first direction. Also, the table arrangement includes a mechanisms for rotating the printed circuit board on the table arrangement about an axis perpendicular to both the first and second directions. The sucking nozzles of the first mounting head place the electronic parts on the printed circuit board on the table arrangement when the first mounting head is in the region above the printed circuit board. The sucking nozzles of the second mounting head place the electronic parts on the printed circuit board on the table arrangement when the second mounting head is in the region above the printed circuit board.

21 Claims, 26 Drawing Sheets

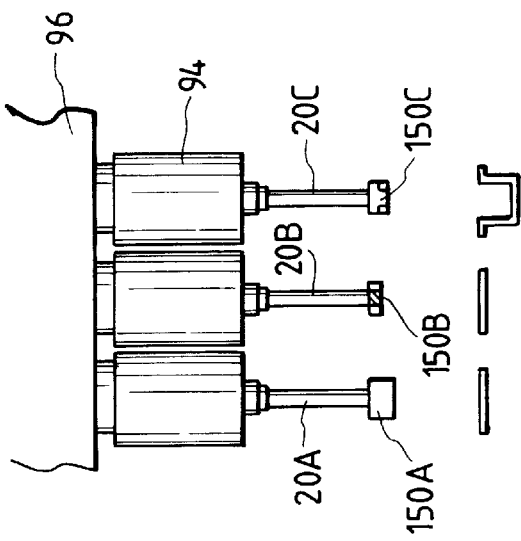
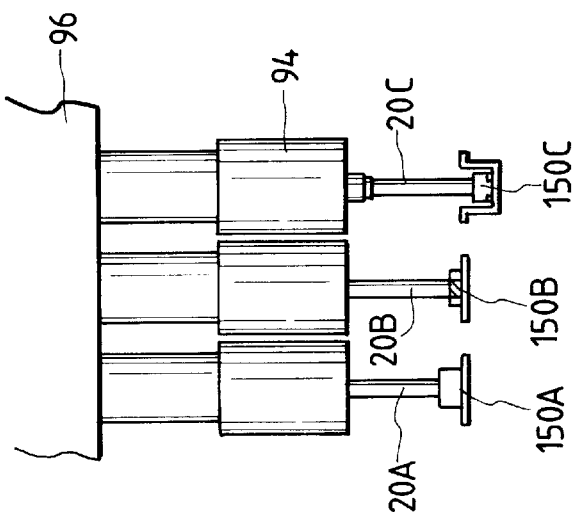
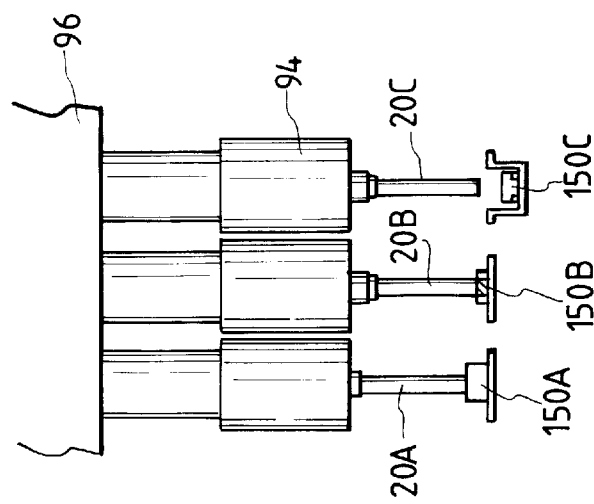

ELECTRONIC-PARTS MOUNTING APPARATUS

BACKGROUND OF THE INVENTION

1. Field of the Invention

This invention relates to an apparatus for automatically mounting electronic parts on a printed circuit board.

2. Description of the Related Art

Japanese published unexamined patent application 6-85492 discloses an electronic-parts mounting apparatus which handles electronic parts (electronic components) carried on a tape. The apparatus of Japanese application 6-85492 includes an electronic-parts feeder having a cassette for feeding taped electronic parts one by one. The apparatus of Japanese application 6-85492 also includes a mounting head provided with a sucking nozzle for picking up electronic parts (electronic components) from the carrier tape one by one. The sucking nozzle holds the picked-up electronic component. The mounting head is movably supported by a first drive shaft. The first drive shaft is movably connected with a second drive shaft. The first drive shaft and the second drive shaft are perpendicular to each other. The mounting head can move along an X direction and a Y direction perpendicular to each other. The sucking nozzle and the mounting head cooperate to receive electronic components from the electronic-parts feeder one by one, and to carry each of the electronic components to a specified position relative to a printed circuit board. The electronic components are mounted on the printed circuit board one by one.

The apparatus of Japanese application 6-85492 further includes an electronic-parts recognizing section which detects conditions of an electronic component held by the sucking nozzle. Specifically, the electronic-parts recognizing section detects a positional error between the electronic component and the sucking nozzle. The detected positional error is used in correcting the positioning of the electronic component relative to the printed circuit board by the mounting head.

The apparatus of Japanese application 6-85492 mounts electronic parts (electronic components) on a printed circuit board one by one. Accordingly, the speed or rate of mounting one electronic component tends to be low.

Japanese published unexamined patent application 7-202491 discloses an electronic-parts mounting apparatus which includes a mounting head having a plurality of sucking nozzles arranged along a circle. The mounting head is intermittently rotated. The sucking nozzles pick up electronic parts (electronic components) supplied by an electronic-parts feeder. The sucking nozzles hold the picked-up electronic parts. The apparatus of Japanese application 7-20202491 also includes an XY table supporting a printed circuit board. The XY table can move an X direction and a Y direction perpendicular to each other. The printed circuit board moves together with the XY table. As the mounting head is rotated, each of the electronic parts held by the sucking nozzles is carried to a specified position relative to the printed circuit board. The electronic parts are mounted on the printed circuit board. The apparatus of Japanese application 7-202491 further includes an electronic-parts recognizing section which detects conditions of an electronic component held by each sucking nozzle.

The apparatus of Japanese application 7-202491 tends to be expensive and large in size.

SUMMARY OF THE INVENTION

It is an object of this invention to provide an improved electronic-parts mounting apparatus.

A first aspect of this invention provides an electronic-parts mounting apparatus comprising cassettes containing electronic parts; first and second feeders for feeding the electronic parts from the cassettes; a first mounting head having sucking nozzles for picking up the electronic parts fed by the first feeder; a second mounting head having sucking nozzles for picking up the electronic parts fed by the second feeder; a table arrangement for holding a printed circuit board; first means for alternately moving the first and second mounting heads along a first direction to a region corresponding to a position of the printed circuit board on the table arrangement; second means contained in the table arrangement for moving the printed circuit board on the table arrangement in a second direction perpendicular to the first direction; third means contained in the table arrangement for rotating the printed circuit board on the table arrangement about an axis perpendicular to both the first and second directions; fourth means for allowing the sucking nozzles of the first mounting head to place the electronic parts on the printed circuit board on the table arrangement when the first mounting head is in the region; and fifth means for allowing the sucking nozzles of the second mounting head to place the electronic parts on the printed circuit board on the table arrangement when the second mounting head is in the region.

A second aspect of this invention is based on the first aspect thereof, and provides an electronic-parts mounting apparatus further comprising sixth means for detecting whether or not the sucking nozzles of the first mounting head fail to pick up the electronic parts, for detecting postures of the electronic parts held by the sucking nozzles of the first mounting head, and for detecting heights of the electronic parts held by the sucking nozzles of the first mounting head; and seventh means for detecting whether or not the sucking nozzles of the second mounting head fail to pick up the electronic parts, for detecting postures of the electronic parts held by the sucking nozzles of the second mounting head, and for detecting heights of the electronic parts held by the sucking nozzles of the second mounting head.

A third aspect of this invention is based on the first aspect thereof, and provides an electronic-parts mounting apparatus wherein the table arrangement comprises a motor, a speed-reduction device connected to an output shaft of the motor, a table connected to the speed-reduction device and rotating as the output shaft of the motor rotates, and a holding member connected to the table for holding the printed circuit board.

A fourth aspect of this invention is based on the third aspect thereof, and provides an electronic-parts mounting apparatus wherein the table arrangement further comprises means for carrying the printed circuit board to and from the holding member, and means for locating the printed circuit board on the holding member.

A fifth aspect of this invention is based on the first aspect thereof, and provides an electronic-parts mounting apparatus further comprising a printed-circuit-board feeder for feeding the printed circuit board to the table arrangement, and a printed-circuit-board carrier for carrying the printed circuit from the table arrangement.

A sixth aspect of this invention is based on the first aspect thereof, and provides an electronic-parts mounting apparatus further comprising a motor, and a power transmission mechanism connected between the motor and the printed-circuit-board feeder.

A seventh aspect of this invention is based on the fifth aspect thereof, and provides an electronic-parts mounting apparatus wherein the printed-circuit-board feeder comprises guide members for guiding opposite sides of the printed circuit board, respectively.

An eighth aspect of this invention is based on the fourth aspect thereof, and provides an electronic-parts mounting apparatus further comprising a motor, and a power transmission mechanism connected between the motor and the locating means in the table arrangement.

A ninth aspect of this invention is based on the fifth aspect thereof, and provides an electronic-parts mounting apparatus further comprising a stopper for stopping the printed circuit board at a predetermined position above the table arrangement which is fed by the printed-circuit-board feeder.

A tenth aspect of this invention is based on the first aspect thereof, and provides an electronic-parts mounting apparatus wherein the cassettes comprise a bulk-type cassette containing electronic parts in bulk, and a taping-type cassette containing chip-type electronic parts attached to a tape at given intervals.

An eleventh aspect of this invention is based on the first aspect thereof, and provides an electronic-parts mounting apparatus wherein the sucking nozzles of the second mounting head places the electronic parts on the printed circuit board on the table arrangement while the sucking nozzles of the first mounting head pick up the electronic parts fed by the first feeder, and wherein the sucking nozzles of the first mounting head places the electronic parts on the printed circuit board on the table arrangement while the sucking nozzles of the second mounting head pick up the electronic parts fed by the second feeder.

A twelfth aspect of this invention is based on the first aspect thereof, and provides an electronic-parts mounting apparatus wherein the sucking nozzles of the first and second mounting heads are arranged at a pitch corresponding to a pitch between paths of feed of electronic parts from the cassettes.

A thirteenth aspect of this invention is based on the first aspect thereof, and provides an electronic-parts mounting apparatus wherein each of the first and second mounting heads comprises a motor, a cam member connected to an output shaft of the motor, a cam follower engaging the cam member, a plate connected to the cam follower and holding the sucking nozzles, the sucking nozzles being elevated and lowered as the output shaft of the motor rotates.

A fourteenth aspect of this invention is based on the thirteenth aspect thereof, and provides an electronic-parts mounting apparatus further comprising means for varying lower limit positions of the sucking nozzles by controlling a range of rotation of the output shaft of the motor with respect to the cam member.

A fifteenth aspect of this invention is based on the thirteenth aspect thereof, and provides an electronic-parts mounting apparatus wherein a speed of movement of the sucking nozzles is low when the sucking nozzles are positionally close to their upper limit positions and their lower limit positions.

A sixteenth aspect of this invention is based on the thirteenth aspect thereof, and provides an electronic-parts mounting apparatus further comprising means for controlling a speed of rotation of the output shaft of the motor.

A seventeenth aspect of this invention is based on the first aspect thereof, and provides an electronic-parts mounting apparatus further comprising means for simultaneously elevating and lowering the sucking nozzles of the first mounting head, and means for simultaneously elevating and lowering the sucking nozzles of the second mounting heads.

An eighteenth aspect of this invention is based on the first aspect thereof, and provides an electronic-parts mounting apparatus further comprising means for sequentially elevating and lowering the sucking nozzles of the first mounting head at different timings, and means for sequentially elevating and lowering the sucking nozzles of the second mounting heads at different timings.

A nineteenth aspect of this invention is based on the first aspect thereof, and provides an electronic-parts mounting apparatus further comprising sixth means for selecting at least one sucking nozzle from among the sucking nozzles of the first mounting head; seventh means for elevating and lowering the selected sucking nozzle of the first mounting head; eighth means for selecting at least one sucking nozzle from among the sucking nozzles of the second mounting head; and ninth means for elevating and lowering the selected sucking nozzle of the second mounting head.

A twentieth aspect of this invention is based on the nineteenth aspect thereof, and provides an electronic-parts mounting apparatus further comprising tenth means for inhibiting sucking nozzles of the first mounting head which are not selected by the sixth means from being elevated and lowered by the seventh means; and eleventh means for inhibiting sucking nozzles of the second mounting head which are not selected by the eighth means from being elevated and lowered by the ninth means.

A twenty-first aspect of this invention is based on the thirteenth aspect thereof, and provides an electronic-parts mounting apparatus further comprising springs connected to the sucking nozzles of the first and second mounting heads for urging the sucking nozzles downward.

A twenty-second aspect of this invention is based on the first aspect thereof, and provides an electronic-parts mounting apparatus further comprising sixth means for detecting whether or not each of the electronic parts is normally held by the related sucking nozzle of the first mounting head; seventh means for removing the electronic parts from the related sucking nozzles which are detected by the sixth means to be not normally held by the related sucking nozzles; eighth means for detecting whether or not each of the electronic parts is normally held by the related sucking nozzle of the second mounting head; and ninth means for removing the electronic parts from the related sucking nozzles which are detected by the eighth means to be not normally held by the related sucking nozzles.

BRIEF DESCRIPTION OF THE DRAWINGS

FIGS. 39, 40, 41, and 42 are diagrammatic views of a mounting head and electronic parts in a third embodiment of this invention which are in different states respectively.

DESCRIPTION OF THE PREFERRED EMBODIMENTS

First Embodiment

Figure 1:
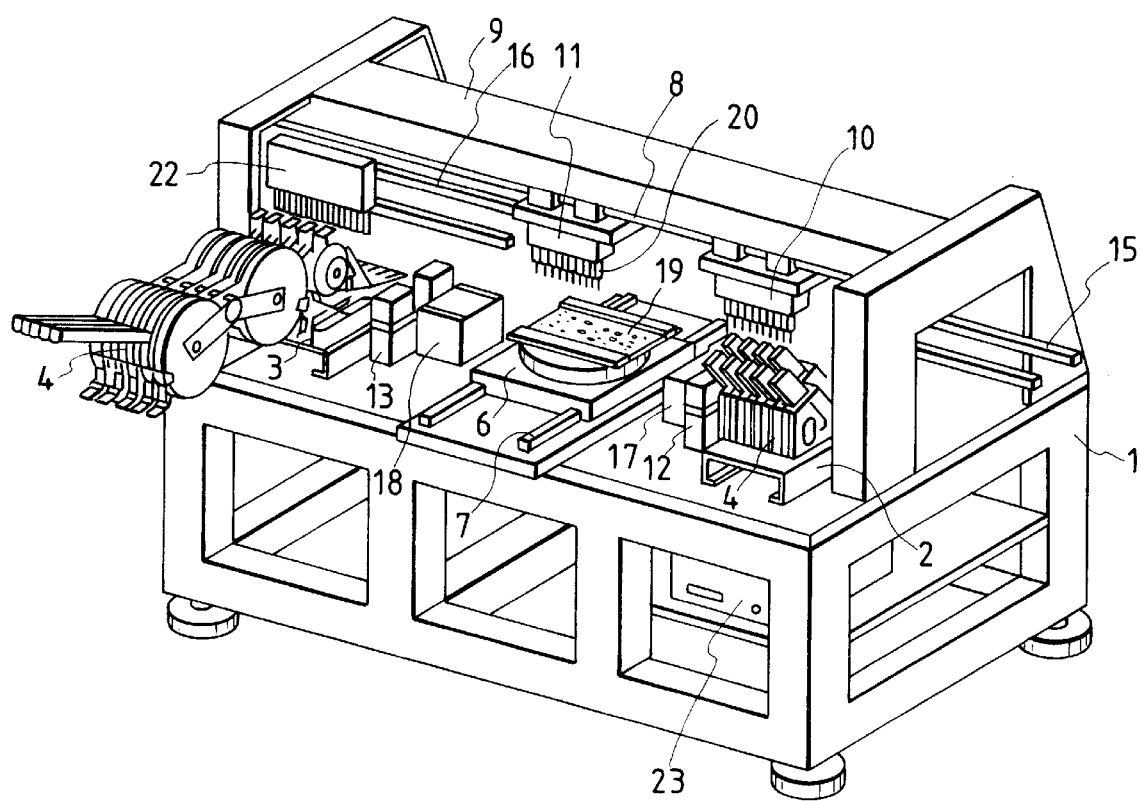
FIG. 1 is a perspective view of an electronic-parts mounting apparatus according to a first embodiment of this invention.
Figure 2:
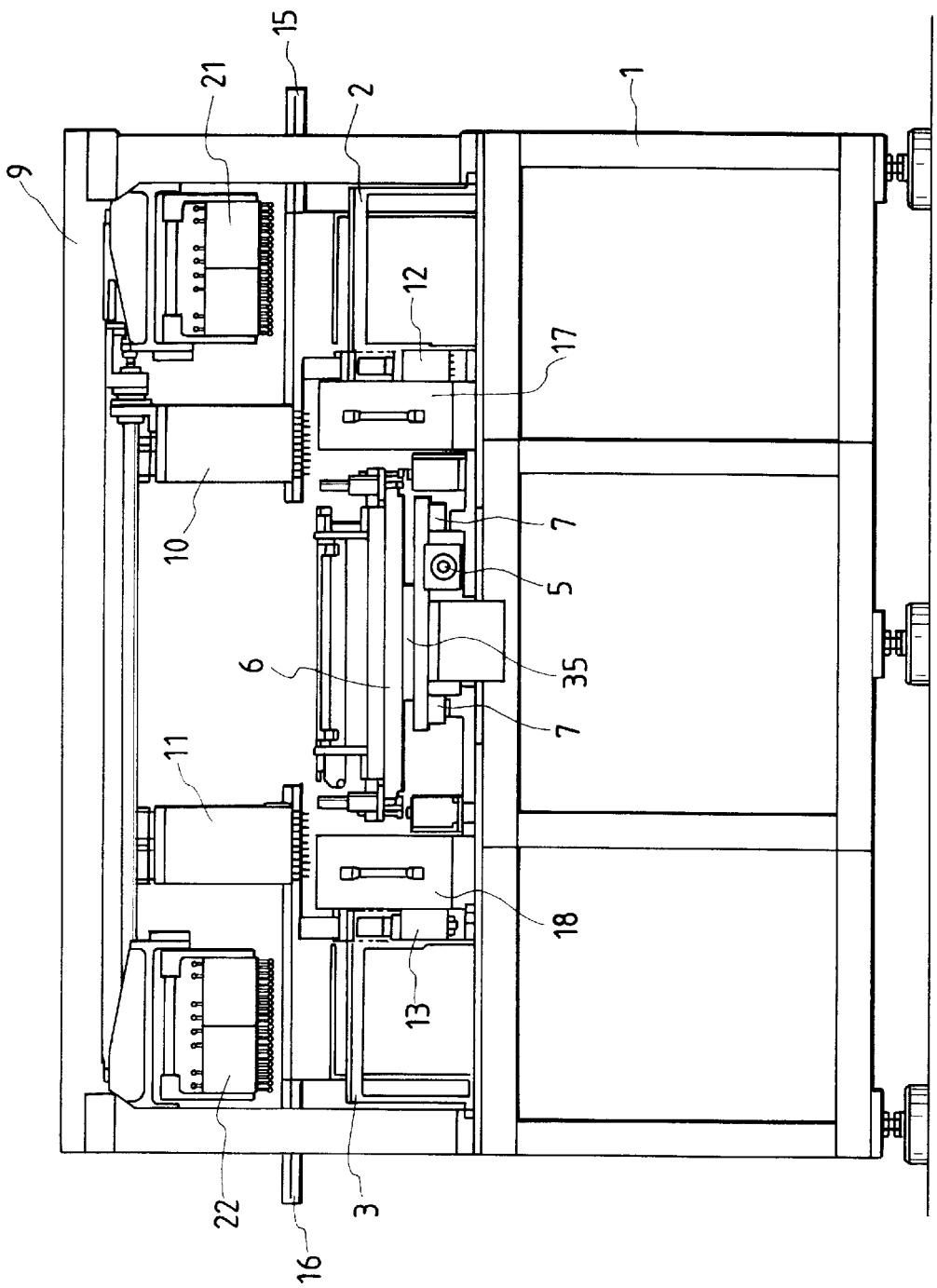
FIG. 2 is a front view of the electronic-parts mounting apparatus in FIG. 1.
Figure 3:
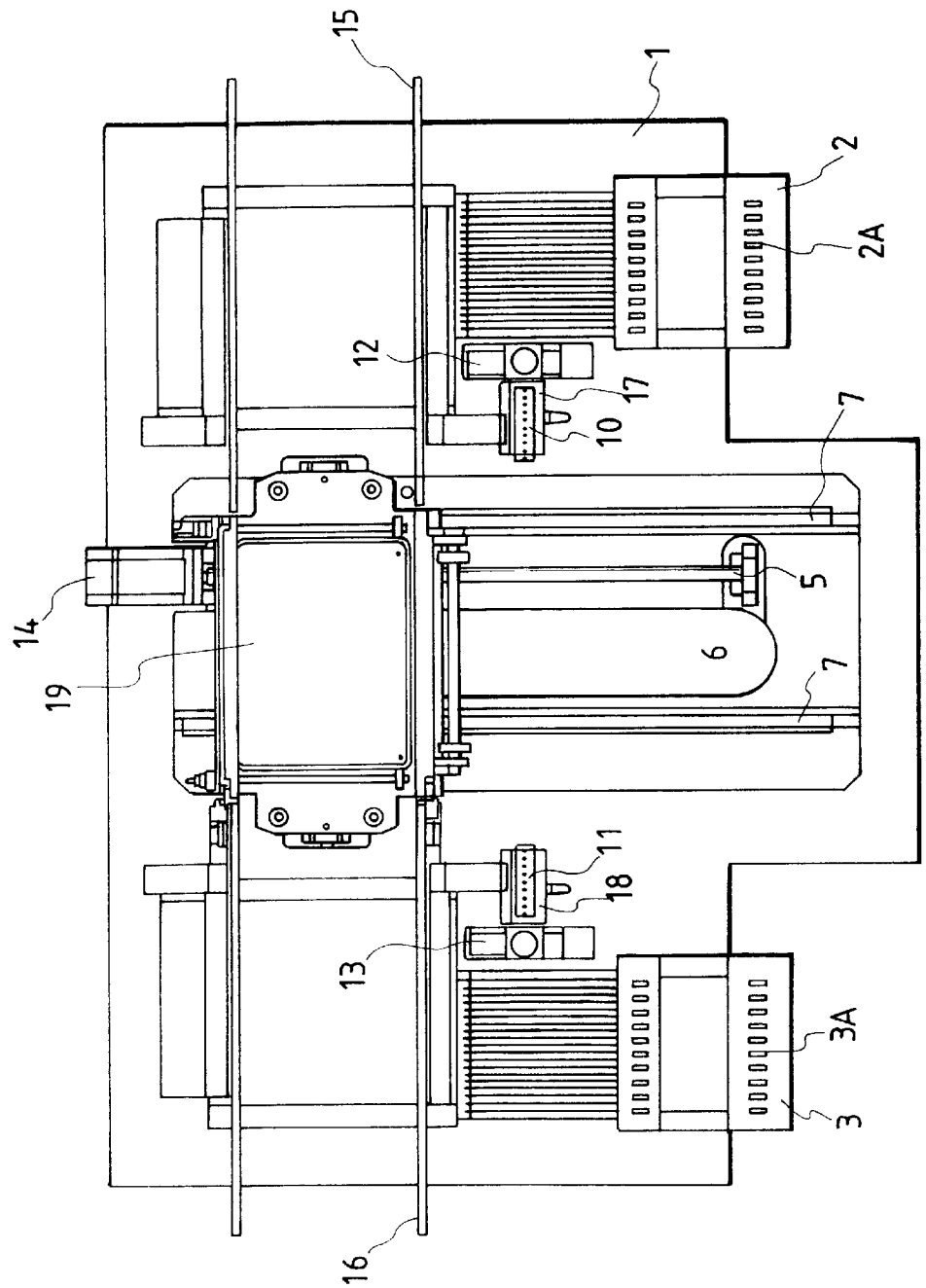
FIG. 3 is a top view of the electronic-parts mounting apparatus in FIG. 1.

With reference to FIGS. 1, 2, and 3, an electronic-parts mounting apparatus in a first embodiment of this invention includes a housing-like base frame 1 on which electronic-pars feeders 2 and 3 are provided. The electronic-parts feeder 2 has a set of cassettes 4 arranged side by side. The electronic-parts feeder 2 is provided with an engagement portion 2A which holds the cassettes 4 in suitable positions respectively. Each of the cassettes 4 in the electronic-parts feeder 2 is designed to sequentially feed electronic parts (electronic components) with the aid of a suitable drive mechanism associated with the electronic-parts feeder 2. Similarly, the electronic-parts feeder 3 has a set of cassettes 4 arranged side by side. The electronic-parts feeder 3 is provided with an engagement portion 3A which holds the cassettes 4 in suitable positions respectively. Each of the cassettes 4 in the electronic-parts feeder 3 is designed to sequentially feed electronic parts (electronic components) with the aid of a suitable drive mechanism associated with the electronic-parts feeder 3. The electronic-parts feeders 2 and 3 are separated from each other by a predetermined interval. The paths of the feed of electronic parts by the electronic-parts feeders 2 and 3 extend along a Y direction in a horizontal plane.

The cassettes 4 in the electronic-parts feeders 2 and 3 are of the bulk type or the taping type. The bulk-type cassettes 4 contain electronic parts in bulk. The taping-type cassettes 4 contain chip-type electronic parts detachably bonded to a tape at given intervals.

A controller 23 supported on the base frame 1 controls various actuators in response to the output signals of various sensors. The controller 23 includes a microcomputer or a similar device which has a combination of an input/output port, a CPU, a ROM, and a RAM. The microcomputer operates in accordance with a program stored in the ROM. Thus, the controller 23 operates in accordance with the program.

A table arrangement 6 supported on the base frame 1 extends between the electronic-parts feeders 2 and 3. An electronic-parts recognizing section 12 is located between the electronic-parts feeder 2 and the table arrangement 6. The electronic-parts recognizing section 12 serves to detect conditions of electronic parts (electronic components) held by sucking nozzles. The electronic-parts recognizing section 12 outputs an electric signal to the controller 23 which represents the detected conditions of the electronic parts held by the sucking nozzles. The electronic-parts recognizing section 12 includes a camera taking an image of each of the electronic parts held by the sucking nozzles as viewed in an upward direction, and also a camera (or a line sensor) taking an image of each of the electronic parts held by the sucking nozzles as viewed in a horizontal direction. The controller 23 responds to the output signal of the electronic-parts recognizing section 12, thereby recognizing the electronic parts and also deciding whether or not the electronic parts are normally held by the sucking nozzles. Thus, the controller 23 decides whether or not the sucking nozzles fail to pick up the electronic parts.

An electronic-parts recognizing section 13 is located between the electronic-parts feeder 3 and the table arrangement 6. The electronic-parts recognizing section 13 serves to detect conditions of electronic parts (electronic components) held by sucking nozzles. The electronic-parts recognizing section 13 outputs an electric signal to the controller 23 which represents the detected conditions of the electronic parts held by the sucking nozzles. The electronic-parts recognizing section 13 includes a camera taking an image of each of the electronic parts held by the sucking nozzles as viewed in an upward direction, and also a camera (or a line sensor) taking an image of each of the electronic parts held by the sucking nozzles as viewed in a horizontal direction. The controller 23 responds to the output signal of the electronic-parts recognizing section 13, thereby recognizing the electronic parts and also deciding whether or not the electronic parts are normally held by the sucking nozzles. Thus, the controller 23 decides whether or not the sucking nozzles fail to pick up the electronic parts.

A defective-parts removing section 17 is located between the table arrangement 6 and the electronic-parts recognizing section 12. The defective-parts removing section 17 is used in removing electronic components from a normal feed path which are decided or founded to be not normally held by the sucking nozzles. A defective-parts removing section 18 is located between the table arrangement 6 and the electronic-parts recognizing section 13. The defective-parts removing section 18 is used in removing electronic components from a normal feed path which are decided or founded to be not normally held by the sucking nozzles.

The table arrangement 6 serves to hold a printed circuit board 19 on upper surfaces thereof. The table arrangement 6 is slidably supported on a pair of guide rails 7. The output shaft of a drive motor 14 is coupled to the table arrangement 6 via a ball screw 5. As the output shaft of the drive motor 14 rotates, the table arrangement 6 slides along the guide rails 7 and moves along the Y direction in the horizontal plane, that is, the direction of the feed of electronic parts by the electronic-parts feeders 2 and 3. The drive motor 14 is controlled in response to the controller 23. Thus, the table arrangement 6 can be controlled by the controller 23.

Mounting heads 10 and 11 are slidably supported by a guide rail or guide rails 8 provided on a lower surface of an upper member (an upper beam) 9 fixedly connected to the base frame 1. Each of the mounting heads 10 and 11 holds a plurality of movable sucking nozzles (movable vacuum nozzles or movable pick-up nozzles) 20. The sucking nozzles 20 can be elevated or lowered relative to the bodies of the mounting heads 10 and 11 by suitable actuators which are controlled in response to output signals of the controller 23. The mounting heads 10 and 11 can slide along the guide rail 8 and move in an X direction in a horizontal plane. The X direction is perpendicular to the Y direction, that is, the direction of the feed of electronic parts by the electronic-parts feeders 2 and 3. The mounting heads 10 and 11 are driven by suitable actuators which are controlled in response to output signals of the controller 23. Thus, the mounting heads 10 and 11 can be controlled by the controller 23. The mounting heads 10 and 11 can move independently of each other.

The mounting head 10 is controlled by the controller 23, being reciprocated between first and second positions along the X direction. When the mounting head 10 is in its first position, the sucking nozzles 20 on the mounting head 10 pick up electronic parts from the electronic-parts feeder 2. The second position of the mounting head 10 corresponds to the position of a printed circuit board 19 on the table arrangement 6.

The sucking nozzles 20 on the mounting head 10 are arranged at a pitch corresponding to a pitch between the paths of the feed of electronic parts from the cassettes 4 in the electronic-parts feeder 2. Specifically, the pitch between the sucking nozzles 20 on the mounting head 10 is equal to the pitch between the paths of the feed of electronic parts from the cassettes 4 in the electronic-parts feeder 2. The pitch between the sucking nozzles 20 on the mounting head 10 may be equal to an integral multiple of the pitch between the paths of the feed of electronic parts from the cassettes 4 in the electronic-parts feeder 2.

The mounting head 11 is controlled by the controller 23, being reciprocated between first and second positions along the X direction. When the mounting head 11 is in its first position, the sucking nozzles 20 on the mounting head 11 pick up electronic parts from the electronic-parts feeder 3. The second position of the mounting head 11 corresponds to the position of a printed circuit board 19 on the table arrangement 6.

The sucking nozzles 20 on the mounting head 11 are arranged at a pitch corresponding to a pitch between the paths of the feed of electronic parts from the cassettes 4 in the electronic-parts feeder 3. Specifically, the pitch between the sucking nozzles 20 on the mounting head 11 is equal to the pitch between the paths of the feed of electronic parts from the cassettes 4 in the electronic-parts feeder 3. The pitch between the sucking nozzles 20 on the mounting head 11 may be equal to an integral multiple of the pitch between the paths of the feed of electronic parts from the cassettes 4 in the electronic-parts feeder 3.

A loader 15 is controlled by the controller 23 to carry a printed circuit board 19 to the table arrangement 6. An unloader 16 is controlled by the controller 23 to carry the printed circuit board 19 from the table arrangement 6. The cassettes 4 in the electronic-parts feeder 2 are driven by a feeding device 21. The cassettes 4 in the electronic-parts feeder 3 are driven by a feeding device 22.

Figure 4:
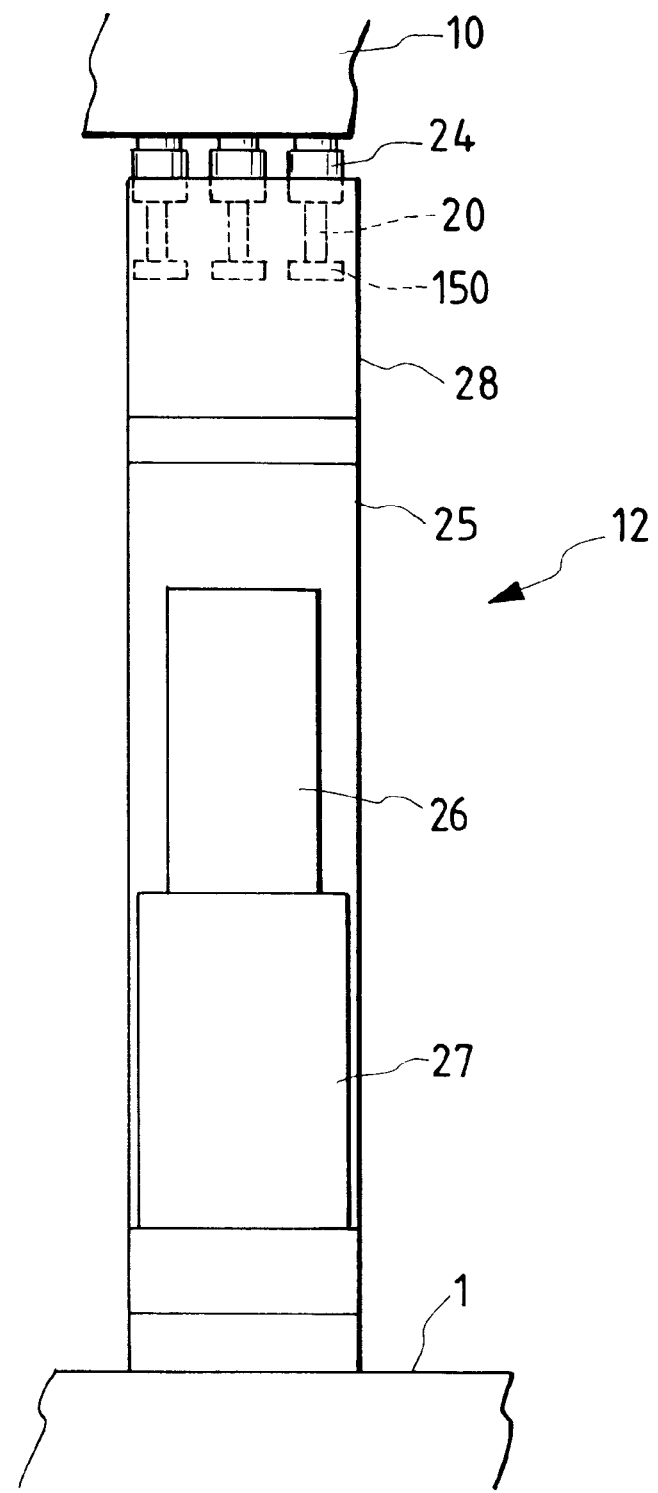
FIG. 4 is a front view of an electronic-parts recognizing section in the electronic-parts mounting apparatus of FIG. 1.
Figure 5:
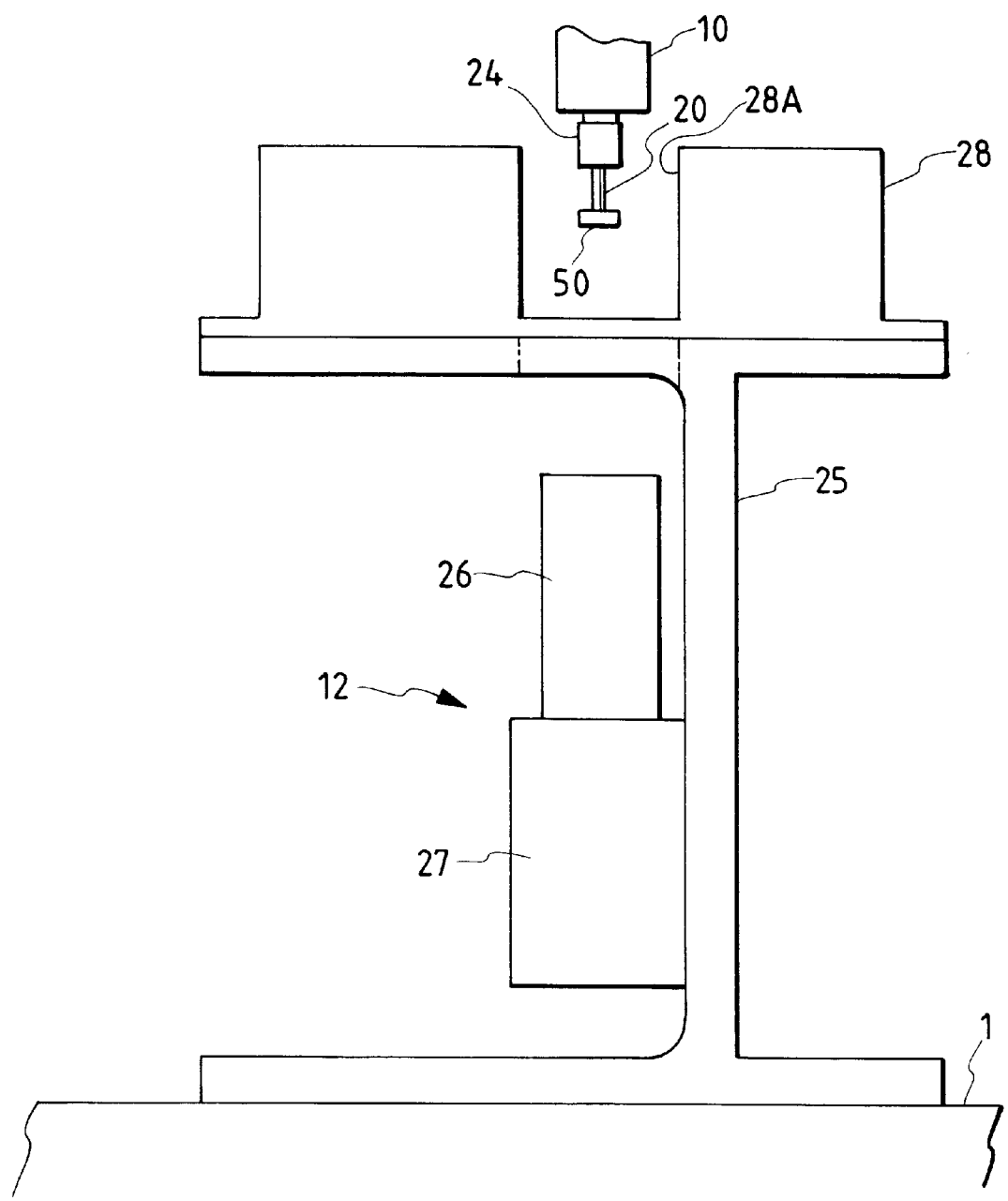
FIG. 5 is a side view of the electronic-parts recognizing section in FIG. 4.

The electronic-parts recognizing sections 12 and 13 have similar structures. Therefore, only the electronic-parts recognizing section 12 and related members will be explained in detail. As shown in FIGS. 4 and 5, the electronic-parts recognizing section 12 includes a camera 27 supported on the base frame 1. Specifically, the camera 27 is attached to a side surface of an I-shaped bracket 25 fixed to an upper surface of the base frame 1. The camera 27 faces upward. The camera 27 has a lens barrel 26. Shafts 24 supported on a body of the mounting head 10 extend downward from the body of the mounting head 10. Sucking nozzles 20 are connected to the shafts 24, respectively. The sucking nozzles 20 extend downward from lower ends of the shafts 24, respectively. The camera 27 takes images of electronic parts 150 held by the sucking nozzles 20 one after another. The camera 27 outputs an electric signal to the controller 23 which represents the images of the electronic parts 150 held by the sucking nozzles 20. A line sensor 28 is attached to an upper surface of the I-shaped bracket 25. The line sensor 28 has a casing or a body formed with a slit 28A for accommodating the sucking nozzles 20. The slit 28A extends in a direction which agrees with the direction of movement of the sucking nozzles 20. Accordingly, the sucking nozzles 20 can be moved along the slit 28A. The line sensor 28 detects the heights of electronic parts 150 held by the sucking nozzles 20 one after another. The line sensor 28 outputs an electric signal to the controller 23 which represents the heights of the electronic parts 150 held by the sucking nozzles 20.

Figure 6:
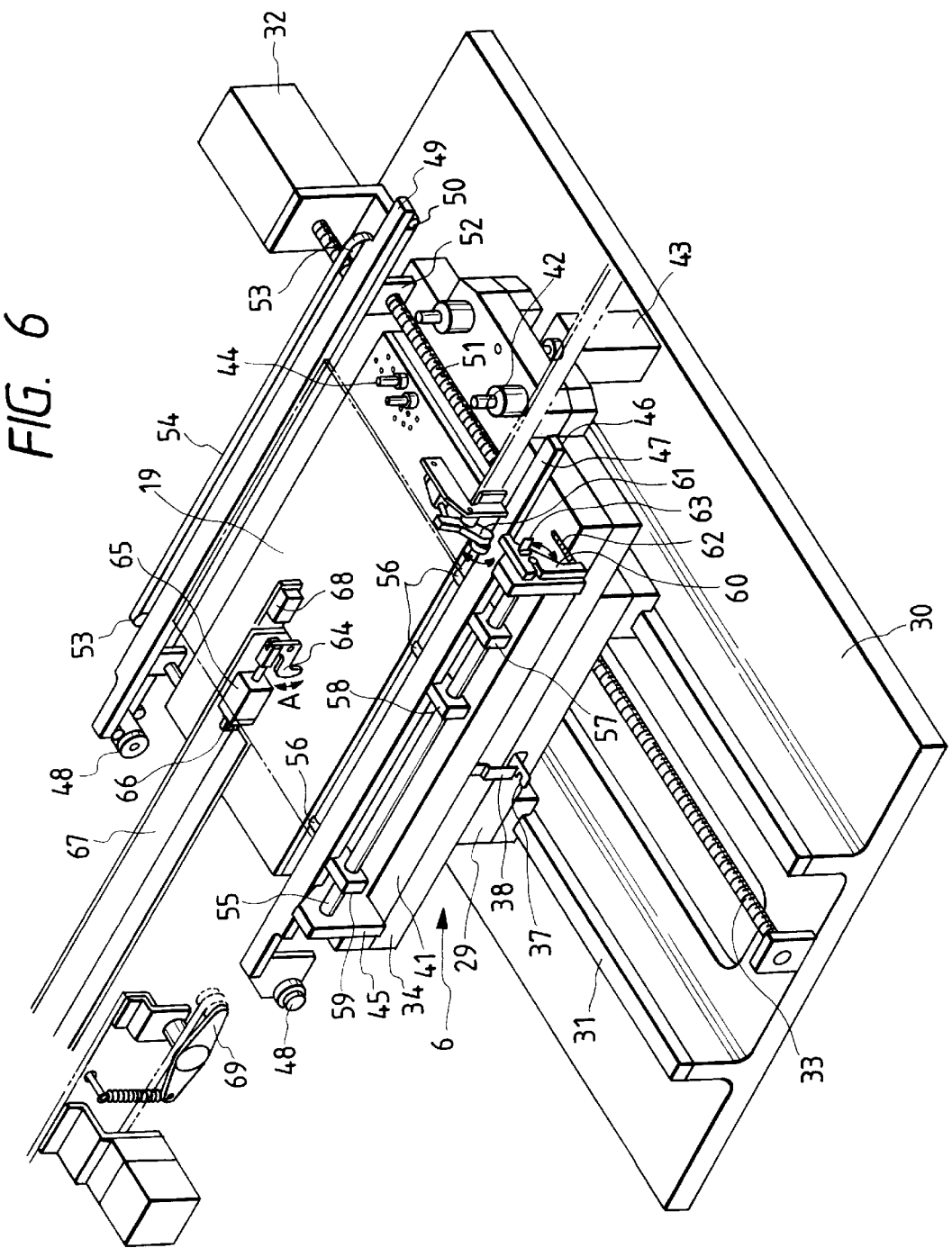
FIG. 6 is a perspective view of a table arrangement in the electronic-parts mounting apparatus of FIG. 1.
Figure 7:
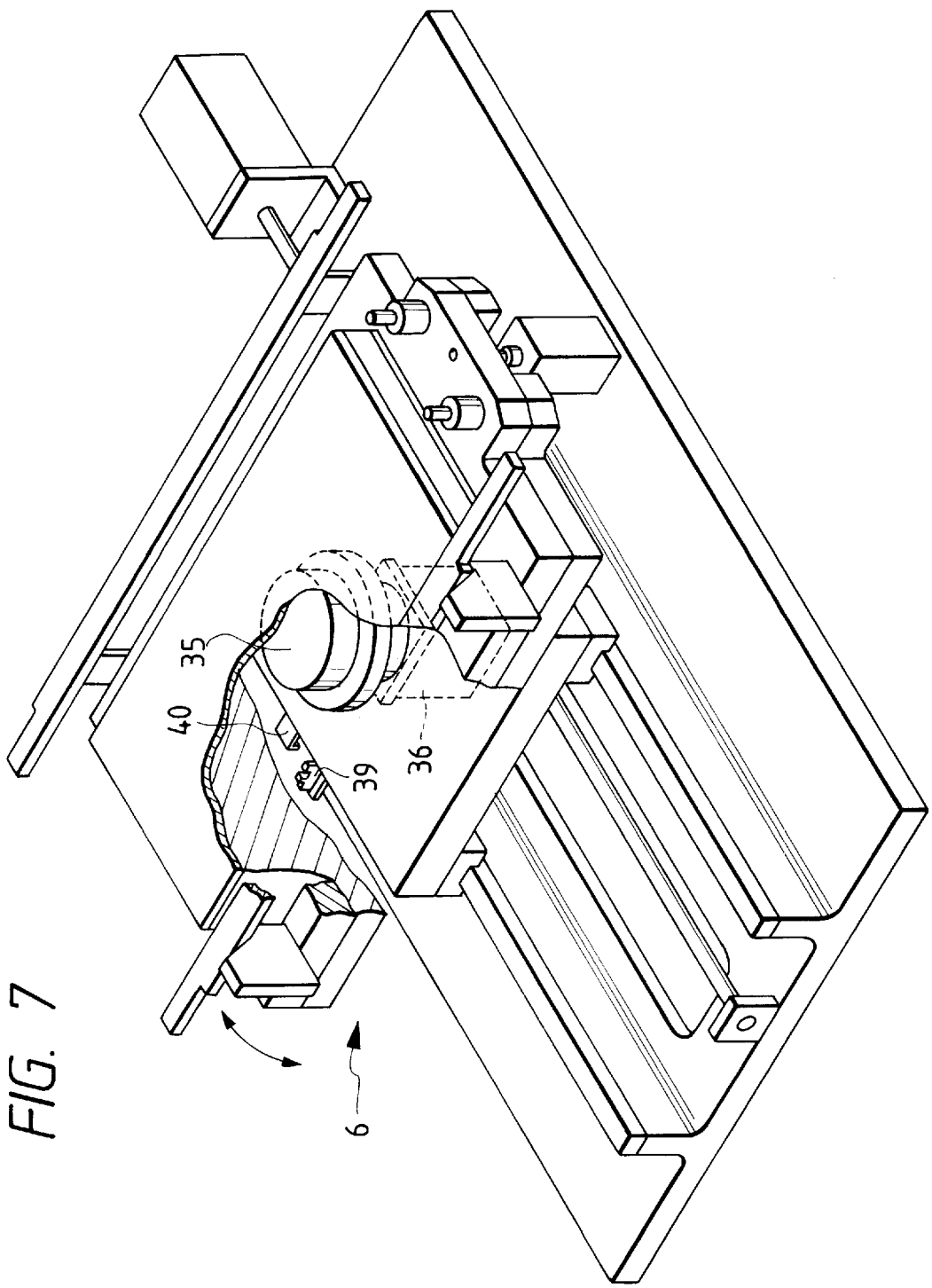
FIG. 7 is a perspective view of a portion of the table arrangement in FIG. 6 with members broken away for the sake of clarity.
Figure 8:
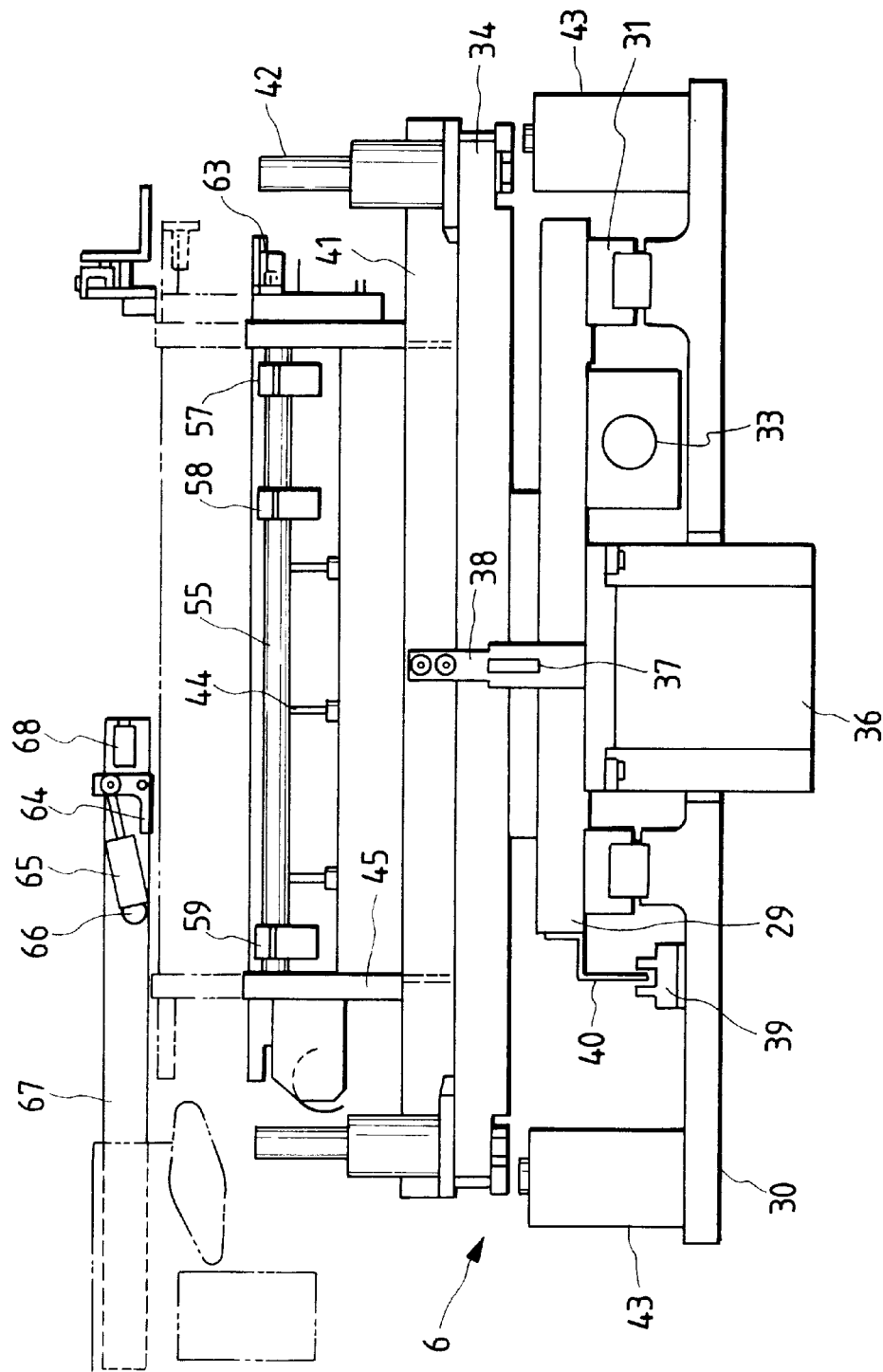
FIG. 8 is a front view of the table arrangement in FIG. 6.

With reference to FIGS. 6, 7, and 8, the table arrangement 6 includes a Y table 29 which is slidably supported by linear guides 31 fixed to a table base 30. The linear guides 31 correspond to the guide rails 7 in FIG. 1. The table base 30 is attached to the base frame 1 (see FIG. 2). The output shaft of a Y-axis motor 32 is coupled to the Y table 29 via a ball screw 33. The Y-axis motor 32 corresponds to the drive motor 14 in FIG. 3. The ball screw 33 corresponds to the ball screw 5 in FIG. 3. As the output shaft of the Y-axis motor 32 rotates, the Y table 29 moves along the Y direction. The Y table 29 can move back and fourth along the Y direction. The Y-axis motor 32 is controlled by an output signal of the controller 23 (see FIG. 1). Thus, the Y table 29 can be controlled by the controller 23.

A sensor 39 attached to the table base 30 detects the Y origin with respect to the position of the Y table 29 relative to the table base 30. The origin sensor 39 outputs an electric signal to the controller 23 (see FIG. 1) which contains information of the Y origin with respect to the position of the Y table 29 relative to the table base 30. A Y origin detection plate 40 is attached to the Y table 29 at a position corresponding to the Y origin. When the Y origin detection plate 40 moves into alignment with the origin sensor 39 and is sensed by the origin sensor 39, the output signal of the origin sensor 39 assumes a state indicating that the position of the Y table 29 relative to the table base 29 agrees with the Y origin.

The table arrangement 6 includes a θ frame or a θ table 34 fixed to the output shaft of a speed-reduction device 35. The speed-reduction device 35 has a casing fixed to the Y table 29. An example of the speed-reduction device 35 is a speed-reduction gear box. The input shaft of the speed-reduction device 35 is coupled to the output shaft of a θ-axis motor 36 which has a casing attached to the Y table 29. Thus, the θ frame 34 is connected via the speed-reduction device 35 to the θ-axis motor 36. As the output shaft of the θ-axis motor 36 rotates, the θ frame 34 rotates relative to the Y table 29 in a horizontal plane (that is, the θ frame 34 moves in a θ direction). Specifically, the θ frame 34 is able to rotate about an axis perpendicular to both the X direction and the Y direction. The θ-axis motor 36 is controlled by an output signal of the controller 23 (see FIG. 1). Thus, the θ frame 34 can be controlled by the controller 23 (see FIG. 1). The θ frame 34 can move in the Y direction together with the Y table 29.

A sensor 37 attached to the Y table 29 detects the θ origin with respect to the angular position of the θ frame 34 relative to the Y table 29. When the θ frame 34 rotates relative to the Y table 29, the origin sensor 37 remains stationary with respect to the Y table 29. The origin sensor 37 outputs an electric signal to the controller 23 (see FIG. 1) which contains information of the θ origin with respect to the angular position of the θ frame 34 relative to the Y table. A θ origin detection plate 38 is attached to the θ frame 34 at a position corresponding to the θ origin. The θ origin detection plate 38 rotates together with the θ frame 34. When the θ origin detection plate 38 moves into alignment or register with the origin sensor 37 and is sensed by the origin sensor 37, the output signal of the origin sensor 37 assumes a state indicating that the angular position of the θ frame 34 relative to the Y table 29 agrees with the θ origin.

A rail frame 41 can move vertically while being guided by vertically-extending guides 42 fixed to the θ frame 34. The rail frame 41 is driven by an actuator or a cylinder 43 having a casing fixed to the table base 30. The rail frame 41 can move upward and downward at a position corresponding to the origin of the Y axis. The cylinder 43 is controlled in response to an output signal of the controller 23 (see FIG. 1). Thus, the rail frame 41 can be controlled by the controller 43 (see FIG. 1). For example, the cylinder 43 is of a pneumatic type, being connected to a solenoid valve controlled by the controller 23 (see FIG. 1).

Vertically-extending backup pins 44 fit into holes in the θ frame 34. The backup pins 44 support a printed circuit board 19 when the rail frame 41 moves downward. The bodies of bearings 45 are fixed to the rail frame 41. A fixed carrier rail 47 is provided on each of the bearings 45. A belt guiding pulley 48 is supported on the fixed carrier rail 47. The belt guiding pulley 48 engages a carrier belt 46 which can be driven by an externally-applied power for carrying the printed circuit board 19. The carrier belt 46 is guided by the fixed carrier rail 47 when being driven.

A movable carrier rail 49 extends in parallel with the fixed carrier rail 47. The movable carrier rail 49 guides a carrier belt 50 which is in engagement with a belt guiding pulley 48. The belt guiding pulley 48 is supported on the movable carrier rail 49. The carrier belt 50 can be driven by an externally-applied power for carrying the printed circuit board 19. The movable carrier rail 49 is attached to nuts 52 engaging ball screws 51 provided on the rail frame 41. As the ball screws 51 rotate, the movable carrier rail 49 moves toward or away from the the fixed carrier rail 47. Generally, the position of the movable carrier rail 49 is adjusted in accordance with the size or the width of a printed circuit board 19. The printed circuit board 19 can be carried by the carrier belts 46 and 50 while opposite sides of the printed circuit board 19 are supported thereby.

A belt-driven rotating members supported on levers 69 (only one of which is shown in FIG. 6) can couple with and uncouple from the belt guiding pulleys 48 in accordance with vertical movement of the fixed carrier rail 47 and the movable carrier rail 49. When the rotating members on the levers 69 couple with the belt guiding pulleys 48, the rotating members rotate the belt guiding pulleys 48 so that the carrier belts 46 and 50 move. When the rotating members on the levers 69 uncouple from the belt guiding pulleys 48, the belt guiding pulleys 48 are released from the rotational forces. Therefore, the belt guiding pulleys 48 stop and also the carrier belts 46 and 50 stop.

The ball screws 51 are perpendicular to the fixed carrier rail 47 and the movable carrier rail 49. Pulleys 53 are attached to ends of the ball screws 51, respectively. The pulleys 53 are connected by a timing belt 54. Thus, the ball screws 51 are connected to each other by the combination of the pulleys 53 and the timing belt 54. As one of the ball screws 51 is rotated, the other ball screw 51 is also rotated.

As previously explained, the bodies of the bearings 45 are fixed to the rail frame 41. A shaft 55 is rotatably supported by the bearings 45. Locating levers 57, 58, and 59 are supported on the shaft 55. The locating levers 57, 58, and 59 have pins 56 for locating the printed circuit board 19. The locating levers 57 and 58 are fixed to the shaft 55. The locating levers 57 and 58 provide references for locating the printed circuit board 19. The position of the locating lever 59 relative to the shaft 55 is adjustable. The position of the locating lever 59 is set in accordance with the size of the printed circuit board 19.

A control lever 60 is fixed to a right-hand end of the shaft 55. When the rail frame 41 is in an elevated position, the control lever 60 can be driven or rotated by an external power transmission member 61. The external power transmission member 61 connects with an actuator or a cylinder (no reference numeral) which is controlled in response to an output signal of the controller 23 (see FIG. 1). Thus, the control lever 60 and the external power transmission member 61 can be controlled by the controller 23 (see FIG. 1). As the control lever 60 is rotated by the external power transmission member 61, the locating pins 57, 58, and 59 also rotate and hence release the printed circuit board 19. A tension spring 62 is connected to the control lever 60. When the control lever 60 separates from the external power transmission member 61, the tension spring 62 returns the control lever 60 to its original position. At the same time, the locating levers 57, 58, and 59 are returned to their original positions where the locating levers 57, 58, and 59 support the printed circuit board 19.

A detection plate 63 is attached to the control lever 60. The detection plate 63 can be detected by a sensor (not shown) provided on another unit. This sensor outputs a signal to the controller 23 (see FIG. 1) which contains information of the position of the control lever 60, that is, information of the positions of the locating levers 57, 58, and 59. This information indicates whether the printed circuit board 19 is held by or released from the locating levers 57, 58, and 59.

A stopper 64 is rotatably provided on a support frame 67 fixed to the base frame 1 (see FIG. 1). The stopper 64 can be driven by an actuator or a cylinder 65 having a casing connected to the support frame 67 via a pin 66. The stopper 64 can rotate in directions denoted by the arrows "A" in FIG. 6. The cylinder 65 is controlled in response to an output signal of the controller 23 (see FIG. 1). Thus, the stopper 64 can be controlled by the controller 23 (see FIG. 1). For example, the cylinder 65 is of a pneumatic type, being connected to a solenoid valve controlled by the controller 23 (see FIG. 1). As previously explained, the printed circuit board 19 is carried by the carrier belts 46 and 50. The stopper 64 serves to stop the printed circuit board 19 at a prescribed position. A sensor 68 attached to the support frame 67 serves to detect whether or not a printed circuit board 19 is present in the prescribed position. An output signal of the sensor 68 is fed to the controller 23 (see FIG. 1).

As previously indicated, the controller 23 (see FIG. 1) operates in accordance with the program. The program has an NC (numerical control) segment for placing or mounting electronic parts on a printed circuit board 19 on the table arrangement 6. Also, the program has a segment for controlling the table arrangement 6. According to the table control segment of the program, the table arrangement 6 operates as follows. After electronic parts are placed or mounted on a printed circuit board 19, the controller 23 controls the Y-axis motor 32 and the θ-axis motor 36 in response to the output signals of the sensors 37 and 39 so that the Y table 29 and the θ frame 34 return to their origin-corresponding positions respectively. Subsequently, the controller 23 controls the cylinder 43 so that the rail frame 41 is elevated. Therefore, the upper surfaces of the carrier belts 46 and 50 guided by the fixed carrier rail 47 and the movable carrier rail 49 move upward to positions equal in height to effective planes of the loader and the unloader 16 (see FIGS. 1, 2, and 3) for a printed circuit board 19 which are located at left-hand and right-hand sides of the table arrangement 6. Then, the controller 23 controls the external power transmission member 61 so that the control lever 60 is rotated by the external power transmission member 61. As a result, the printed circuit board 19 is released from the locating levers 57, 58, and 59.

As the rail frame 41 is elevated, the belt guiding pulleys 48 couple with the rotating members on the levers 69 so that the belt guiding pulleys 48 rotate in accordance with rotation of the rotating members on the levers 69. Thus, the carrier belts 46 and 50 move so that the printed circuit board 19 is carried from the prescribed position. When the sensor 68 informs the controller 23 that the printed circuit board 19 is absent from the prescribed position, the controller 23 controls the cylinder 65 so that the stopper 64 enters a path of the feed of a printed circuit board 19.

Then, the carrier belts 46 and 50 are loaded with a new printed circuit board 19 by the loader 15 (see FIGS. 1, 2, and 3). As the new printed circuit board 19 is moved by the carrier belts 46 and 50, the new printed circuit board 19 encounters the stopper 64 and hence stops at the prescribed position. When the new printed circuit board 19 reaches the prescribed position, the sensor 68 detects that the new printed circuit board 19 is present in the prescribed position. The controller 23 controls the cylinder 43 in response to the output signal of the sensor 68 so that the rail frame 41 is lowered. As the rail frame 41 is lowered, the belt guiding pulleys 48 uncouple from the rotating members on the levers 69. Thus, the carrier belts 46 and 50 stop. At the same time, the controller 23 controls the external power transmission lever 61 in response to the output signal of the sensor 68 so that the external power transmission lever 61 separates from the control lever 60. Thus, the tension spring 62 forces the locating levers 57, 58, and 59 to hold the new printed circuit board 19. In this way, the new printed circuit board 19 is located at the suitable position. The sensor cooperating with the detection plate 63 informs the controller 23 that the new printed circuit board 19 is suitably located. Then, the controller 23 controls the cylinder 65 so that the stopper 64 returns to its inoperative position or its rest position. Subsequently, the controller 23 controls the cylinder 43 so that the rail frame 41 is lowered to a given position.

When the printed circuit board 19 has been replaced by a new one in this way, electronic parts are placed or mounted on the new printed circuit board 19 according to the NC segment of the program. During the electronic-parts mounting process, the controller 23 decides the postures of electronic parts held by the sucking nozzles 20 in response to the output signals of the electronic-parts recognizing sections 12 and 13. In addition, the controller 23 calculates a corrective quantity of the position of the new printed circuit board 19 for each of the electronic parts in response to the decided posture thereof. Furthermore, the controller 23 corrects a first desired position of the new printed circuit board 19 into a second desired position for each of the electronic parts according to the calculated corrective quantity.

During the electronic-parts mounting process, the controller 23 controls the Y-axis motor 32 and the θ-axis motor 36 so that the new printed circuit board 19 is moved to a position corresponding to the second desired position for each of the electronic parts. During the electronic-parts mounting process, the sucking nozzles on the mounting heads 10 and 11 place or mount electronic parts on the new printed circuit board 19. After the electronic parts have been placed or mounted on the new printed circuit board 19, the controller 23 returns the Y table 29 and the θ frame 34 to their origin-corresponding positions respectively. A sequence of these processes is periodically reiterated.

The movements of the sucking nozzles 20 relative to the bodies of the mounting heads 10 and 11 are limited to those in the upward and downward directions. The sucking nozzles 20 are inhibited from rotating. This design of the sucking nozzles 20 enables a good durability of bearings for the sucking nozzles 20.

Figure 9:
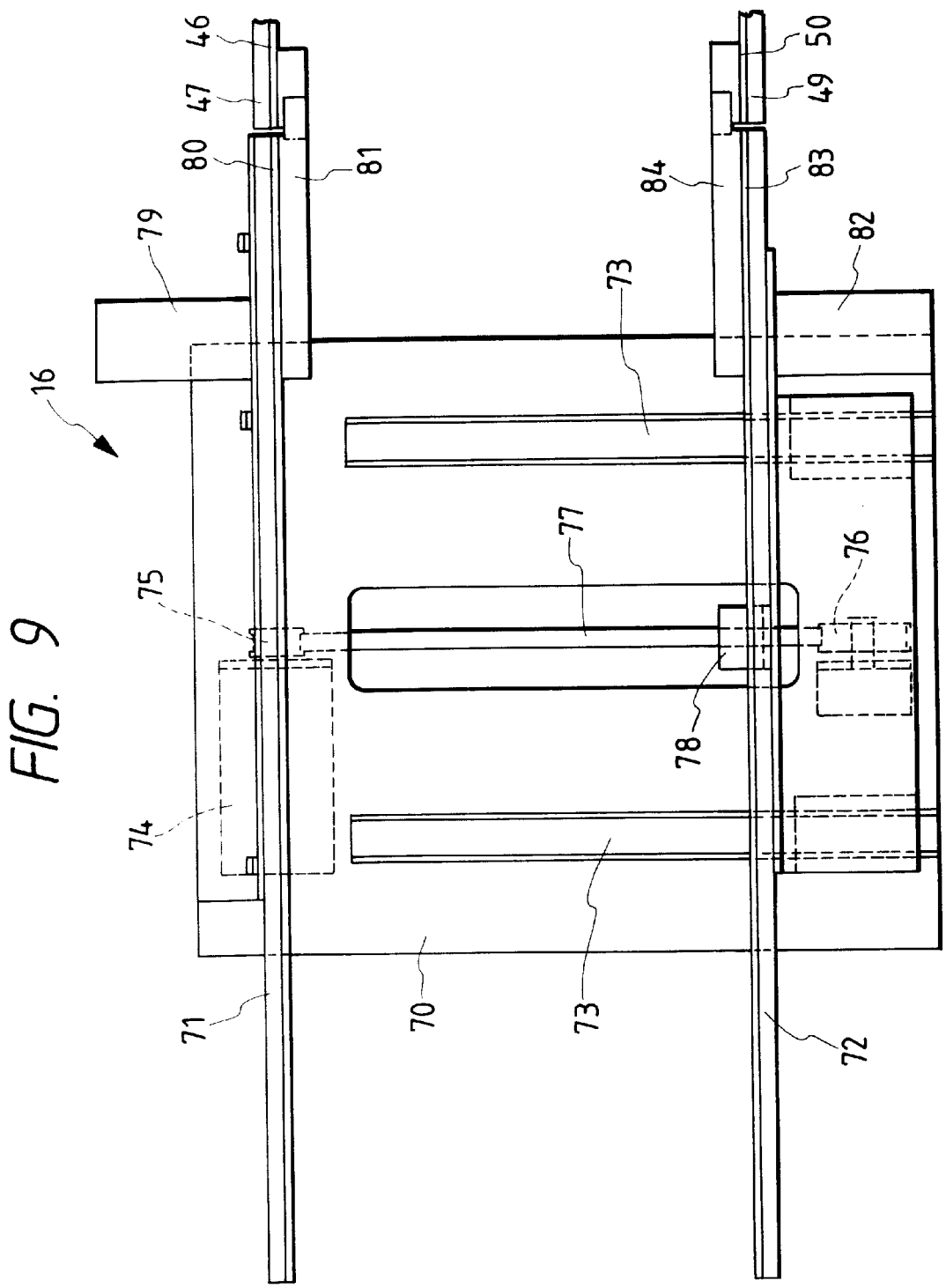
FIG. 9 is a top view of an unloader in the electronic-parts mounting apparatus of FIG. 1.

With reference to FIG. 9, the unloader 16 for carrying a printed circuit board 19 from the table arrangement 6 includes an unloader base 70 fixed to the base frame 1 (see FIG. 1). The unloader 16 also includes a fixed carrier rail 71 and a movable carrier rail 72 for carrying a printed circuit board 19. The fixed carrier rail 71 and the movable carrier rail 72 are located on an upper surface of the unloader base 70. The fixed carrier rail 71 and the movable carrier rail 72 are parallel to each other. The movable carrier rail 72 can slide on a pair of guide rails 73 toward and away from the fixed carrier rail 71. The position of the movable carrier rail 72 is adjusted in accordance with the size or the width of the printed circuit board 19. The guide rails 73 are parallel to each other. The output shaft of a drive motor 74 connects with a pulley 75. A pulley 76 is rotatably provided on the unloader base 70. The pulleys 75 and 76 are connected by a belt 77. The movable carrier rail 72 is attached to the belt 77 by a connection member 78. As the pulley 75 is rotated by the drive motor 74, the belt 77 moves and also the movable carrier rail 72 moves relative to the fixed carrier rail 71.

The fixed carrier rail 71 serves to guide a carrier belt 80. The carrier belt 80 is driven by a motor 79 via a drive mechanism 81. In addition, the carrier belt 46 associated with the fixed carrier rail 47 of the table arrangement 6 can be driven by the motor 79 via the drive mechanism 81.

The movable carrier rail 72 serves to guide a carrier belt 83. The carrier belt 83 is driven by a motor 82 via a drive mechanism 84. In addition, the carrier belt 50 associated with the movable carrier rail 49 of the table arrangement 6 can be driven by the motor 82 via the drive mechanism 84.

Figure 10:
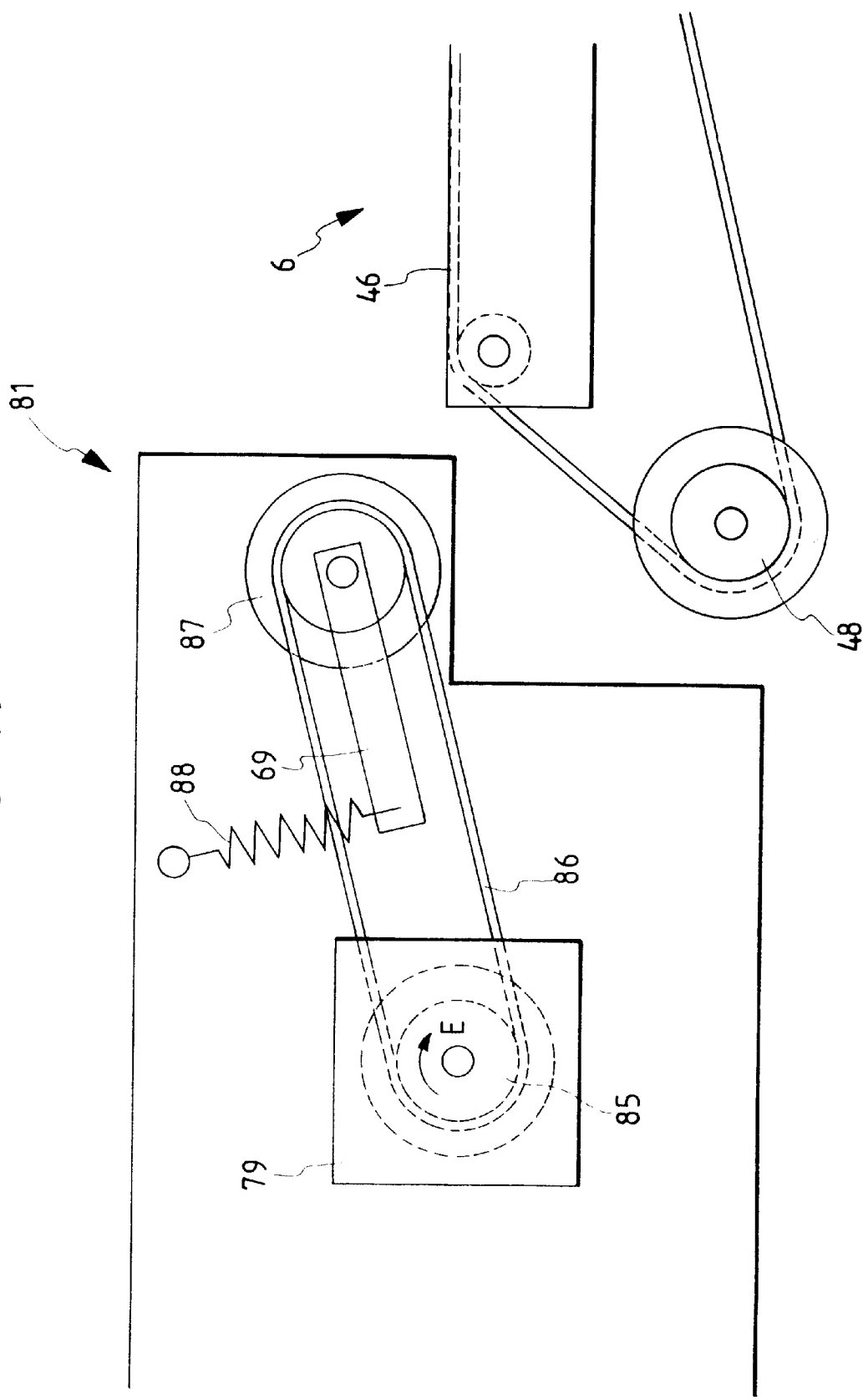
FIG. 10 is a front view of a first portion of a drive mechanism in the electronic-parts mounting apparatus of FIG. 1.

The drive mechanisms 81 and 84 have similar structures. Therefore, only the drive mechanism 81 and related members will be explained in detail. As shown in FIG. 10, the drive mechanism 81 includes a roller 85 attached to the output shaft of the motor 79. The drive mechanism 81 also includes a roller 87 connected to the roller 85 by a belt 86. As the roller 85 is driven by the motor 79, the belt 86 moves and the roller 87 rotates. The belt guiding pulley 48 in the table arrangement 6 can move into and out of engagement with the roller 87. When the belt guiding pulley 48 moves into engagement with the roller 87, the belt guiding pulley 48 rotates in accordance with rotation of the roller 87. When the belt guiding pulley 48 moves out of engagement with the roller 87, the belt guiding pulley 48 is released from the rotational force. The roller 87 is supported on the lever 69. The belt guiding pulley 48 moves toward and away from the roller 87 in accordance with the vertical movement of the roller 87, that is, the vertical movement of the rail frame 41. When the roller 87 is in engagement with the belt guiding pulley 48, a tension spring 88 connected to the lever 69 urges the roller 87 against the belt guiding pulley 48.

Figure 11:
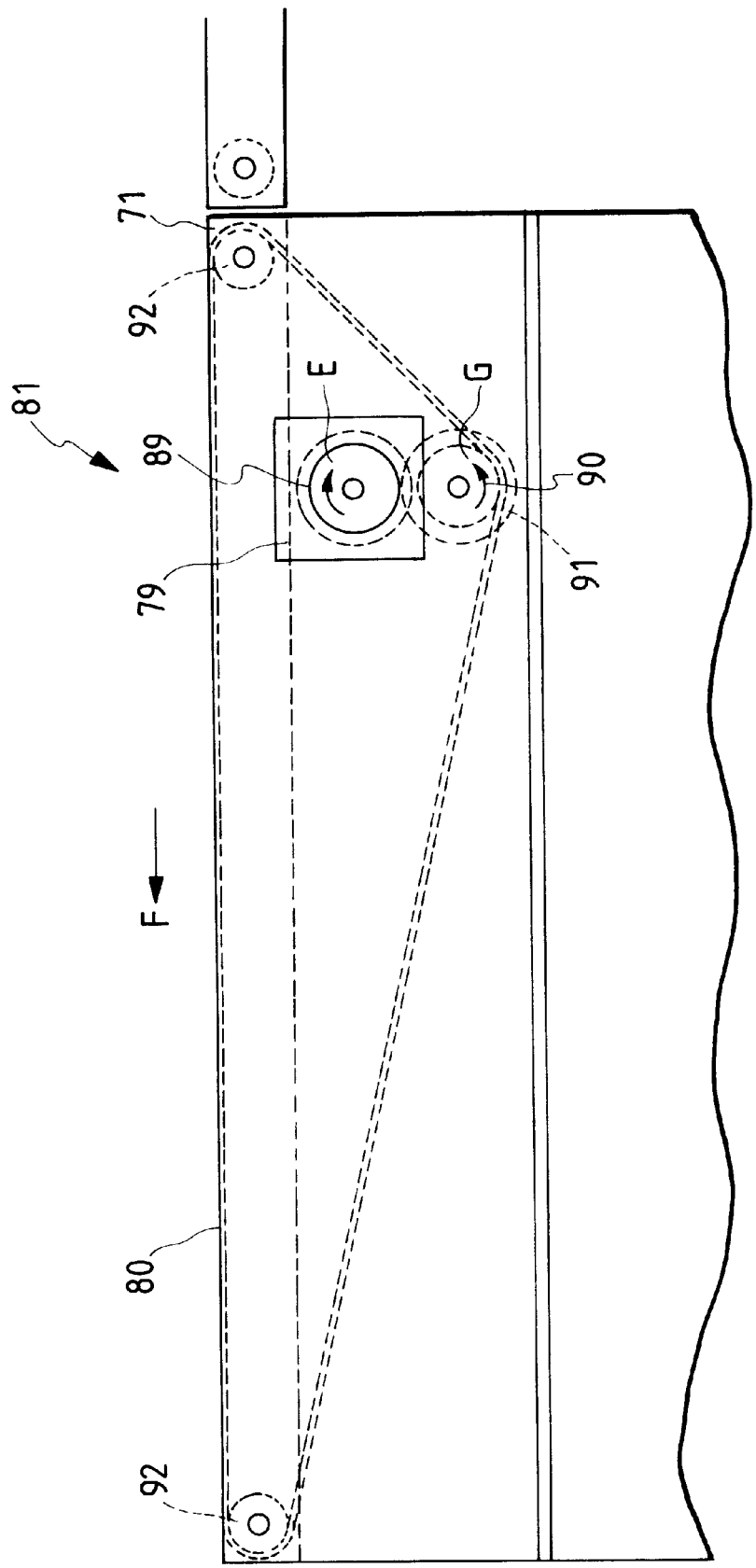
FIG. 11 is a front view of a second portion of the drive mechanism in FIG. 10.

As shown in FIG. 11, the drive mechanism 81 includes a gear 89 attached to the output shaft of the motor 79. The drive mechanism 81 also includes a gear 90 and a pulley 91. The gear 90 meshes with the gear 89. The gear 89 and the pulley 91 are attached to a common shaft. The carrier belt 80 is supported by the pulley 91 and also pulleys 92. The pulleys 92 are supported on opposite ends of the fixed carrier rail 71 (see FIG. 9), respectively. As the gear 89 is driven in a direction "E" by the motor 79, the gear 90 and also the pulley 91 rotate in a direction "G". An upper portion of the carrier belt 80 moves along a direction "F" in accordance with rotation of the pulley 91.

Figure 12:
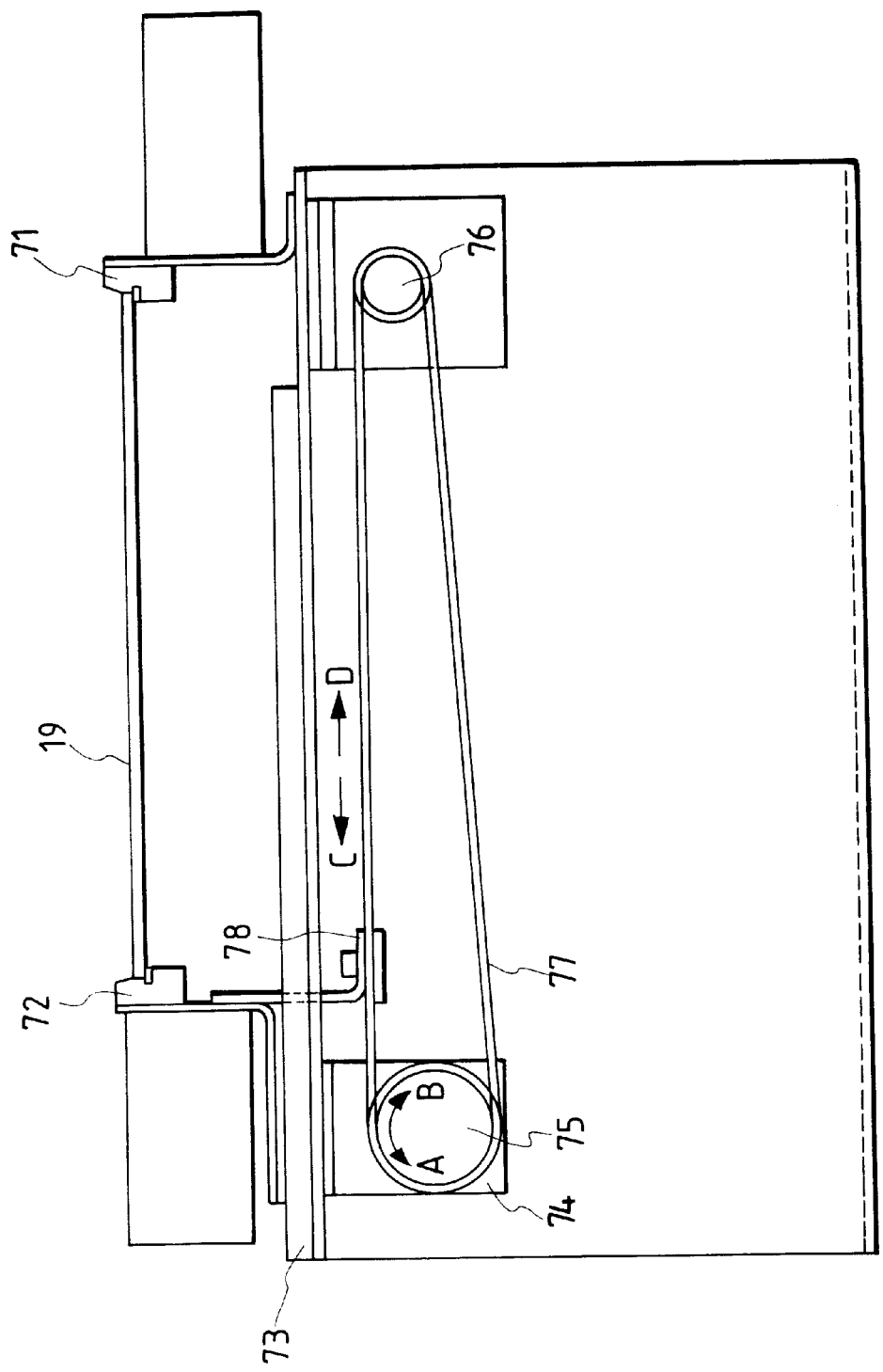
FIG. 12 is a side view of carrier rails and related members in the electronic-parts mounting apparatus of FIG. 1.

With reference to FIGS. 9 and 12, for a printed circuit board 19 having a great width, the pulley 75 is rotated by the drive motor 74 in a direction "A" so that an upper portion of the belt 77 moves in a direction "C". The movable carrier rail 72, which is attached to the upper portion of the belt 77 via the connection member 79, moves away from the fixed carrier rail 71 along the guide rails 73 in accordance with the movement of the upper portion of the belt 77 in the direction "C". For a printed circuit board 19 having a small width, the pulley 75 is rotated by the drive motor 74 in a direction "B" so that the upper portion of the belt 77 moves in a direction "D". The movable carrier rail 72 moves toward the fixed carrier rail 71 along the guide rails 73 in accordance with the movement of the upper portion of the belt 77 in the direction "D".

Figure 13:
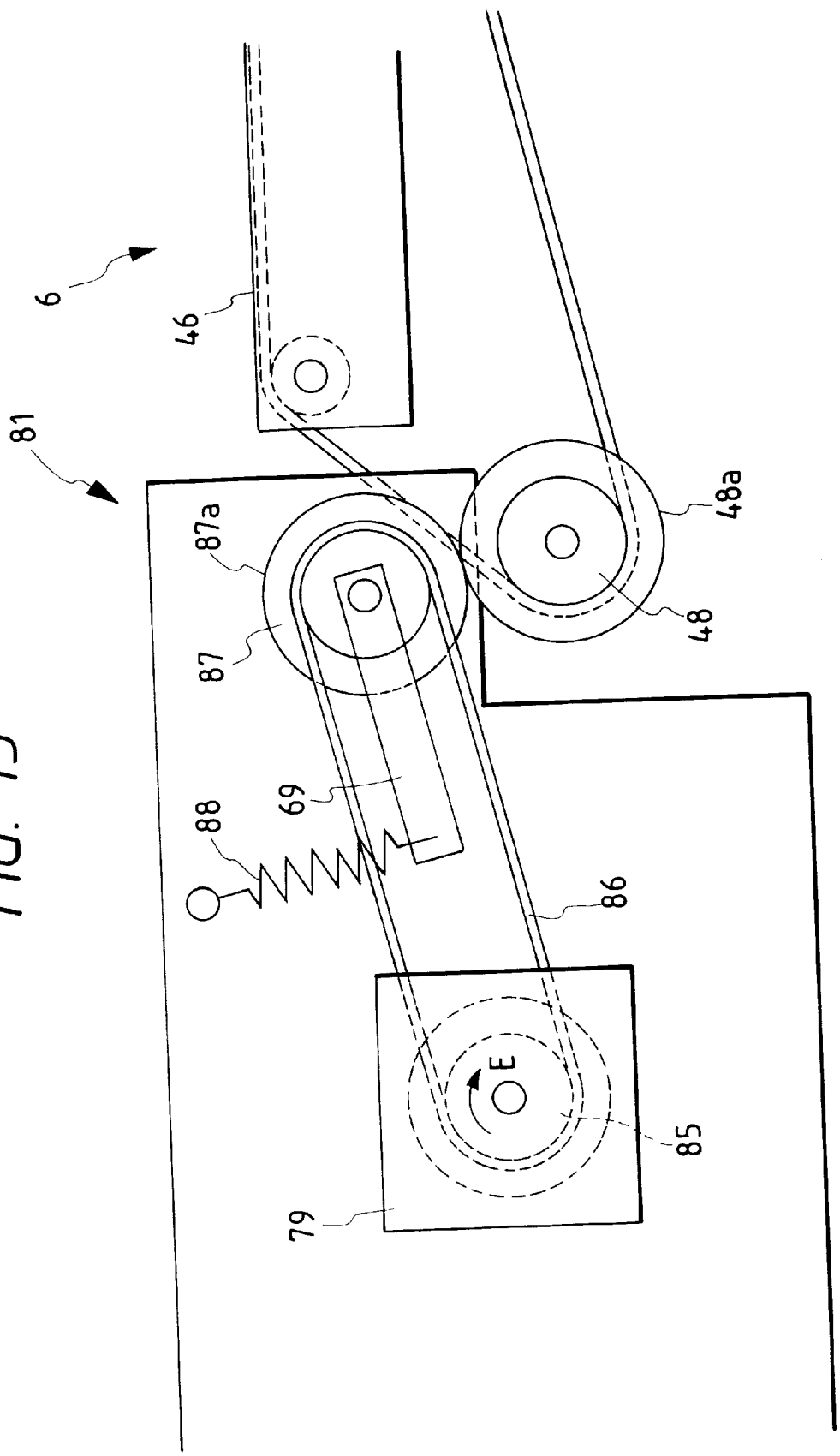
FIG. 13 is a view similar to FIG. 10, showing the drive mechanism in a state different from the state shown in FIG. 10.

During a time interval for the carry of a printed circuit board 19, the rail frame 41 and the belt guiding pulleys 48 are in their elevated positions as shown in FIG. 13. During other time intervals, the rail frame 41 and the belt guiding pulleys 48 are in their lowered positions as shown in FIG. 10. With reference to FIGS. 10 and 13, the belt guiding pulley 48 encounters the roller 87 of the drive mechanism 81 when moving upward. The tension spring 88 connected to the roller 87 via the lever 69 absorbs a shock on the roller 87 when a contact portion 48a of the belt guiding pulley 48 meets a contact portion 87a of the roller 87. As the motor 79 rotates the roller 85 in a direction "E", the belt 86 moves and hence the roller 87 rotates. When the contact portion 87a of the roller 87 remains in engagement with the contact portion 48a of the belt guiding pulley 48, the belt guiding pulley 48 rotates in accordance with rotation of the roller 87. The carrier belt 46 in the table arrangement 6 moves as the belt guiding pulley 48 rotates.

Figure 14:
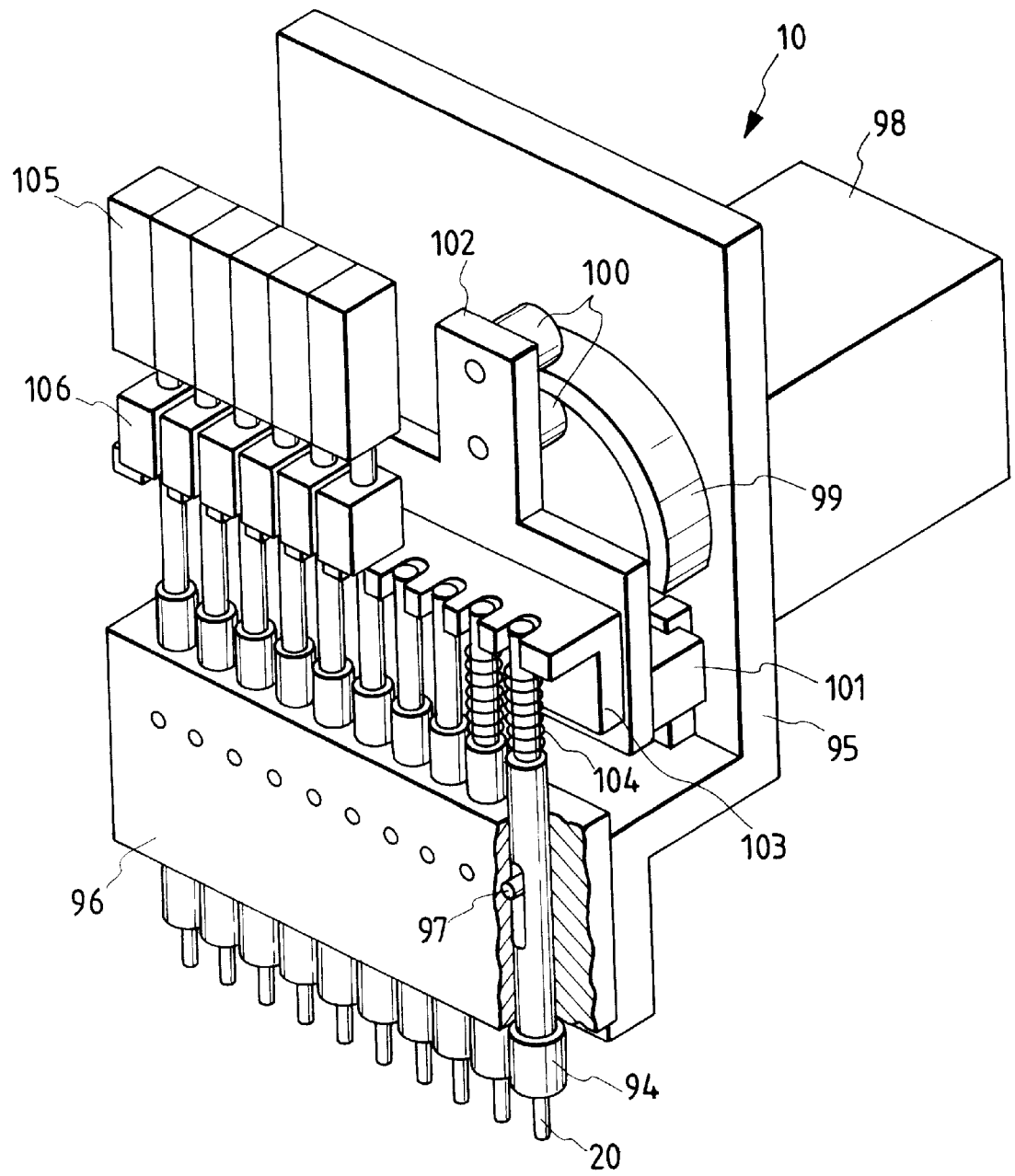
FIG. 14 is a perspective view of a mounting head in the electronic-parts mounting apparatus of FIG. 1.

The mounting heads 10 and 11 have similar structures. Therefore, only the mounting head 10 will be explained in detail. As shown in FIG. 14, the mounting head 10 includes a plurality of sliding shafts 94 holding the sucking nozzles 20 respectively. The sliding shafts 94 are arranged in a line. The sliding shafts 94 are movably connected to a holder 96 fixed to a mounting-head frame 95. The sliding shafts 94 can move upward and downward relative to the holder 96 along axial directions thereof. The sucking nozzles 20 move vertically together with the sliding shafts 94. Pins 97 fixed to the holder 96 engage the sliding shafts 94 respectively. The pins 97 inhibit the sliding shafts 94 from rotating circumferentially.

The mounting head 10 includes a motor 98 having a casing fixed to the mounting-head frame 95. The motor 98 is controlled in response to an output signal of the controller 23 (see FIG. 1). A cam 99 is attached to the output shaft of the motor 98. Cam followers 100 engage the cam 99. The cam followers 100 are connected to a plate 102 movably supported on the mounting-head frame 95 via a slider 101. The plate 102 can move upward and downward relative to the mounting-head frame 95. An engagement member 103 fixed to the plate 102 has grooves into which upper ends of the sliding shafts 94 fit respectively. Compression springs 104 urge the sliding shafts 94 downward, respectively. Actuators or solenoids 105 are connected to the upper ends of the sliding shafts 94 via blocks 106 respectively. The solenoids 105 are controlled by output signals of the controller 23 (see FIG. 1).

Figure 16:
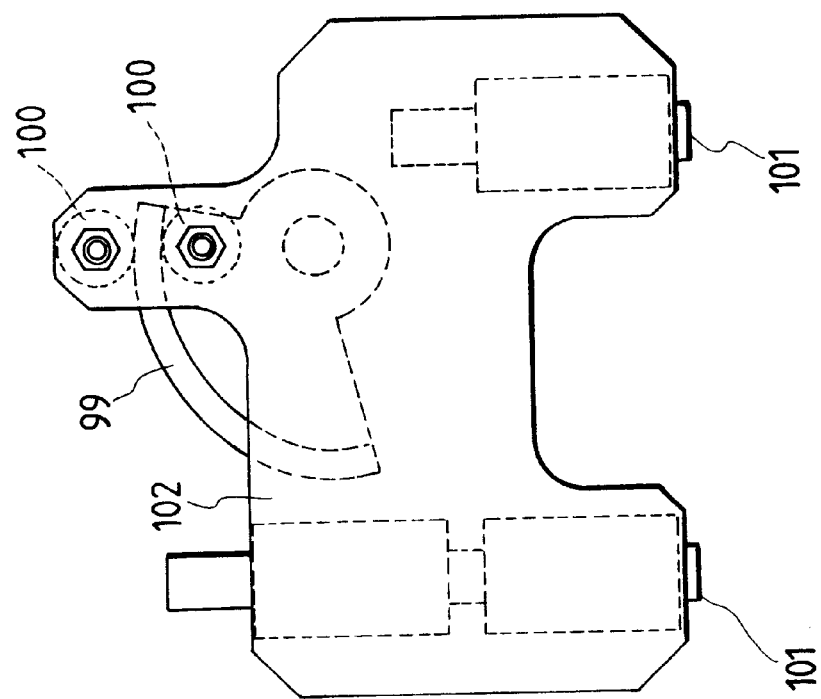
FIGS. 15 and 16 are front views of the mounting head in FIG. 14 which are in different states respectively.
Figure 15:
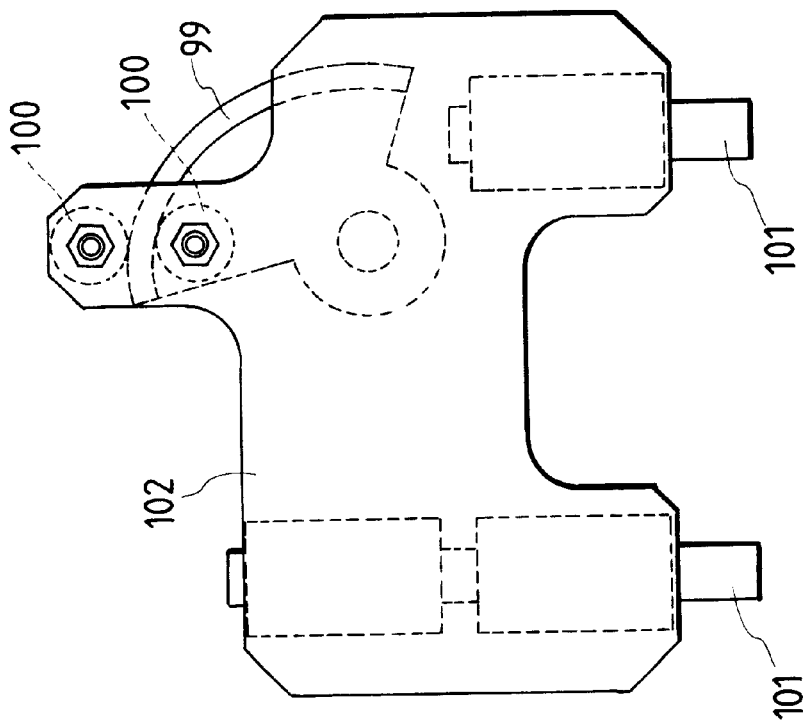
Figure 17:
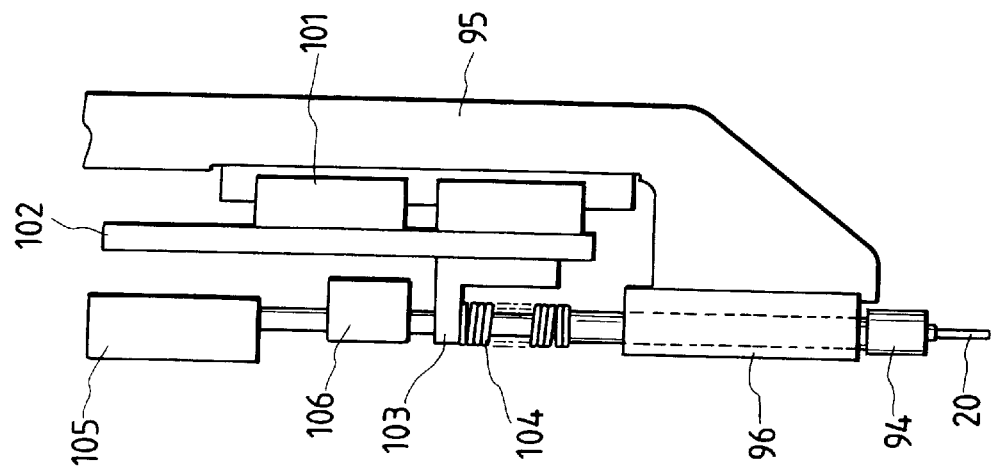
FIGS. 17, 18, and 19 are side views of the mounting head in FIG. 14 which are in different states respectively.
Figure 18:
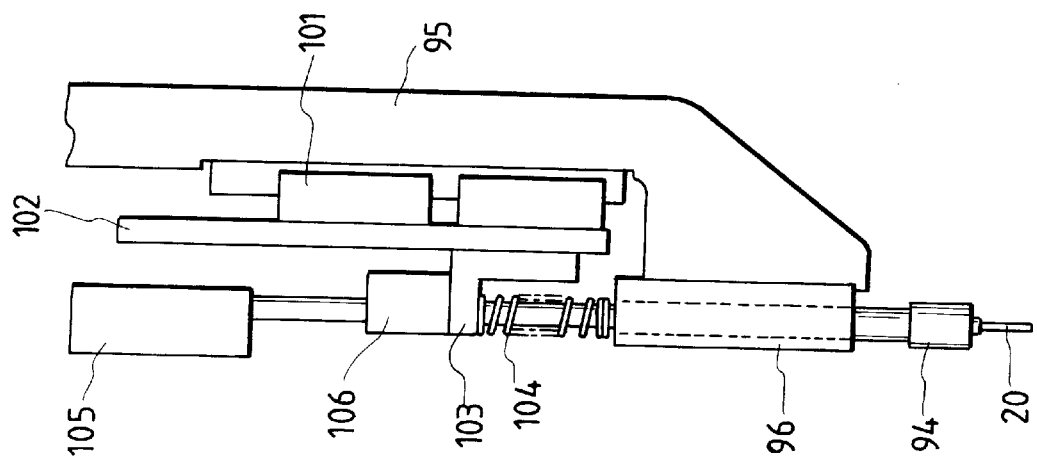
Figure 19:
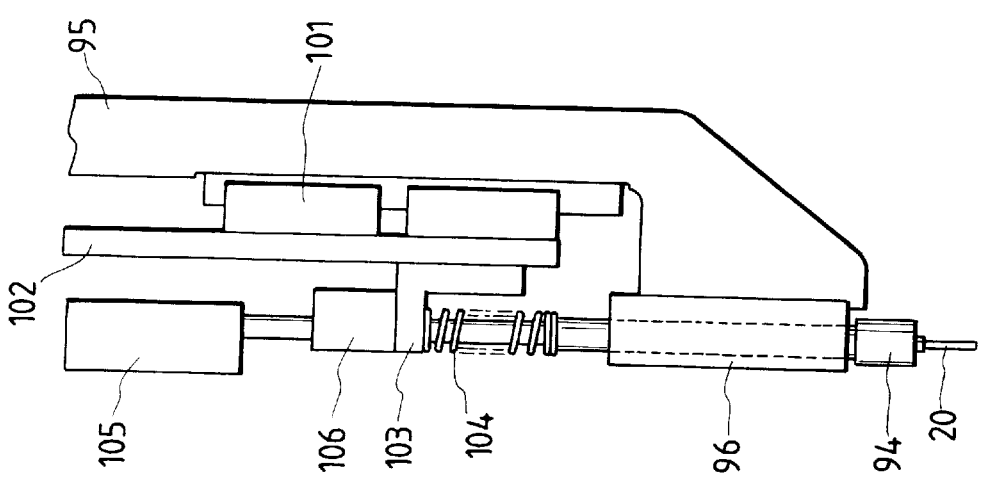
Figure 20:
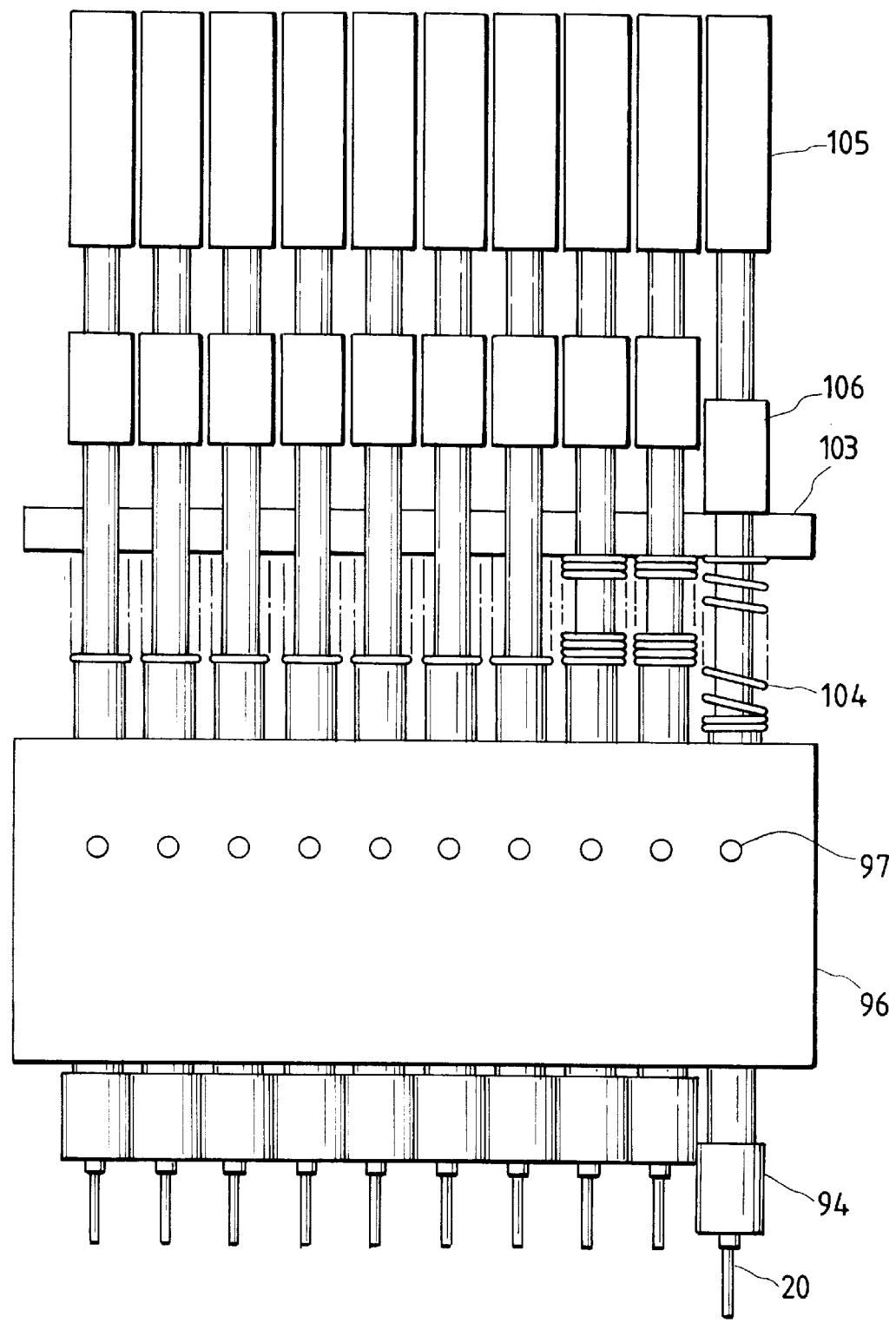
FIG. 20 is a front view of the mounting head in FIG. 14.

With reference to FIGS. 14, 15, and 16, as the cam 99 is rotated by the motor 98, the cam followers 100 move downward and also the plate 102 moves downward. As shown in FIG. 17, the sliding shafts 94 are in their uppermost positions when the plate 102 is in its uppermost position. The solenoids 105 hold the sliding shafts 94 at their uppermost positions when the solenoids 105 are in their on states. When the solenoids 105 are in their off states, the sliding shafts 94 can move upward and downward. With reference to FIG. 18, under conditions where the solenoids 105 are in their off states, as the plate 102 and the engagement member 103 move downward, the engagement member 103 presses the compression springs 104 downward and hence the sliding shafts 94 move downward. With reference to FIG. 19, under conditions where the solenoids 105 are in their on states, as the plate 102 and the engagement member 103 move downward, the engagement member 103 presses the compression springs 104 downward but the sliding shafts 94 remain in their uppermost positions. Accordingly, downward movement (vertical movement) of each of the sliding shaft 94 is selectively permitted and inhibited when the related solenoid 105 is in its off state and its on state respectively. In other words, each of the sliding shafts 94 can be changed between a drivable state and a rest state by controlling the related solenoid 105. As shown in FIG. 20, only arbitrary one of the sliding shafts 94 can be moved downward by suitably controlling the solenoids 105.

As previously indicated, the sucking nozzles 20 move vertically together with the sliding shafts 94. The controller 23 (see FIG. 1) has the function of varying lower limit positions of the sucking nozzles 20 by controlling a range of rotation of the output shaft of the motor 98 with respect to the cam 99.

Figure 21:
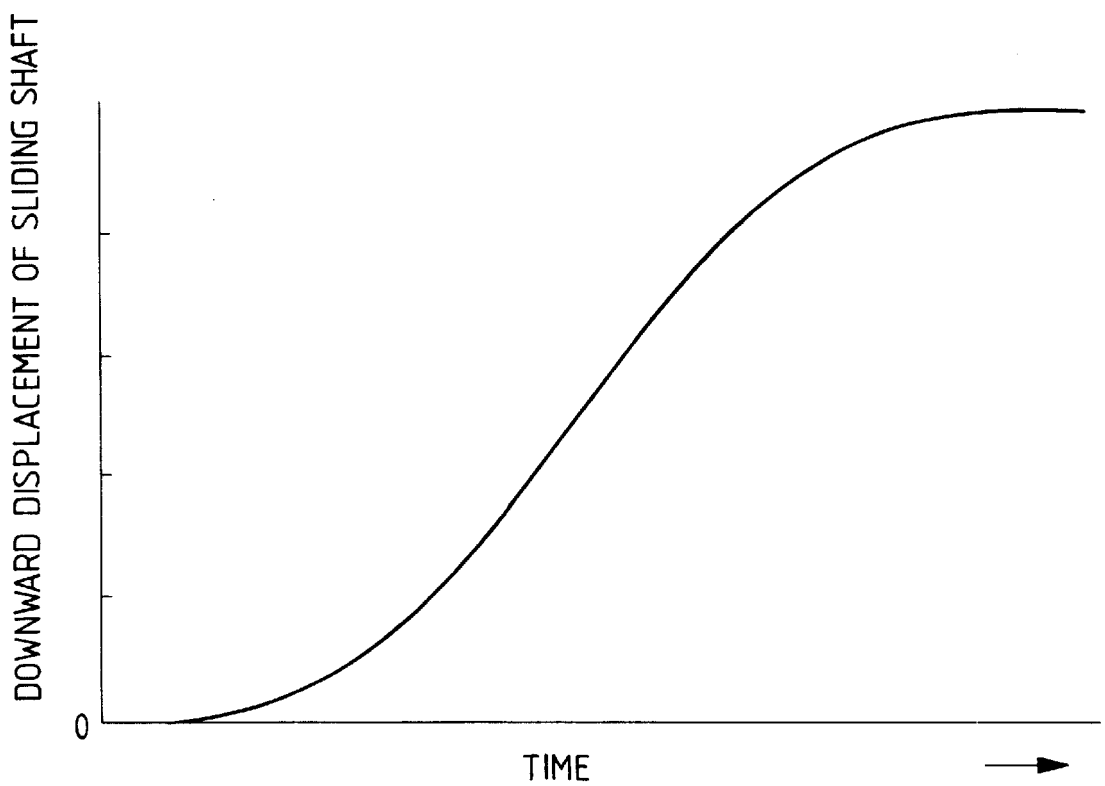
FIG. 21 is a time-domain diagram of vertical displacement of a sliding shaft in the mounting head of FIG. 14.

In the case where the solenoids 105 are in their off states, the sliding shafts 94 move downward as the cam 99 rotates. With reference to FIG. 21, under conditions where the cam 99 rotates at a constant speed, the downward displacement of each of the sliding shafts 94 increases at a varying rate as time goes by. The shape or profile of the cam 99 is designed so that the vertical speed of the sliding shaft 94 will be low when the sliding shaft 94 is close to its uppermost position or its lowermost position. This design enables electronic parts 150 to be gently or softly mounted on a printed circuit board 19. The shape or profile of the cam 99 is preferably designed to provide a great mean of the vertical speed of the sliding shaft 94.

The lower limit position of each of the sliding shafts 94 depends on the thickness of electronic parts 150. The electronic-parts recognizing sections 12 and 13 inform the controller 23 of the thickness of the electronic parts 150. It is preferable that the controller 23 controls the rotational speed of the motor 98 in response to the thickness of the electronic parts 150 to adjust the vertical speed of the sliding shaft 94. According to the adjustment of the vertical speed of the sliding shaft 94, the electronic parts 150 can be softly mounted on a printed circuit board 19.

Figure 22:
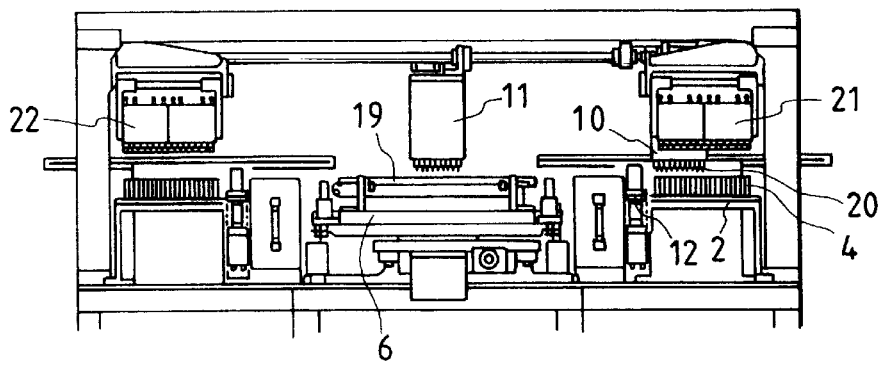
FIGS. 22, 23, 24, and 25 are front views of the electronic-parts mounting apparatus in FIG. 1 which are in different states respectively.

Overall operation of the electronic-parts mounting apparatus will be explained hereinafter. The overall operation of the electronic-parts mounting apparatus is controlled by the controller 23 (see FIG. 1). As shown in FIG. 22, while the mounting head 11 places electronic parts 150 on a printed circuit board 19 on the table arrangement 6, the mounting head 10 is controlled by the controller 23 so that the mounting head 10 is moved along the X direction to a predetermined position related to the cassettes 4 in the electronic-parts feeder 2. The feeding device 21 actuates levers (not shown) of the cassettes 4, and hence opens shutters thereof. The mounting head 10 is controlled by the controller 23 so that the sucking nozzles 20 thereon move downward and access electronic parts 150 in the cassettes 4 via the opened shutters. The sucking nozzles 20 on the mounting head 10 pick up the electronic parts 150, and then move upward.

Figure 23:
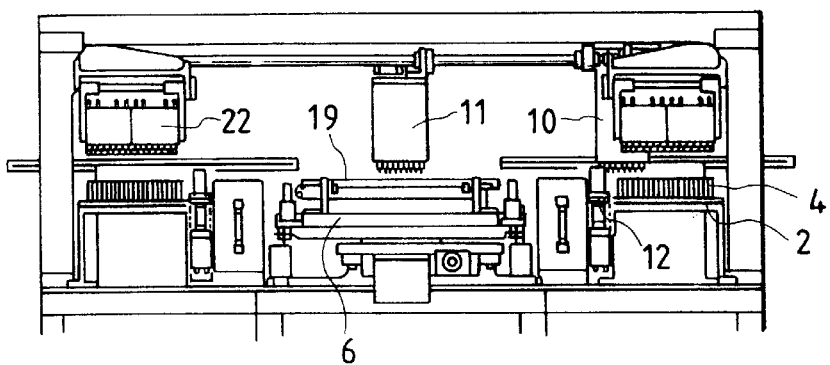

Subsequently, as shown in FIG. 23, the mounting head 10 is controlled by the controller 23 so that the mounting head 10 moves along the X direction to the electronic-parts recognizing section 12. It should be noted that the sucking nozzles 20 on the mounting head 10 hold the electronic parts 150. The electronic-parts recognizing section 12 detects conditions of the electronic parts 150 held by the sucking nozzles 20 on the mounting head 10. The detected conditions of the electronic parts 150 include heights and postures of the electronic parts 150. The electronic-parts recognizing section 12 informs the controller 23 of the detected conditions of the electronic parts 150 held by the sucking nozzles on the mounting head 10. The controller 23 calculates an error between a predetermined reference position and the detected position of each of the electronic parts 150. The controller 23 stores data representative of the calculated positional error in the internal RAM.

Figure 24:
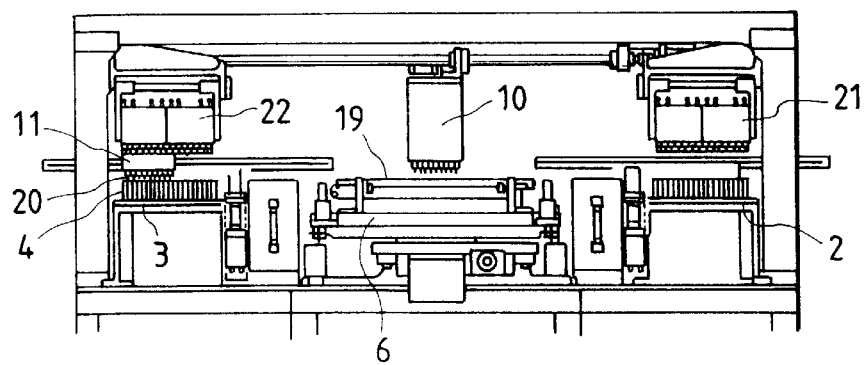

As shown in FIG. 24, after the mounting head 11 completes the electronic-parts mounting process, the mounting head 11 is controlled by the controller 23 so that the mounting head 11 moves from the position above the table arrangement 6. Simultaneously, the mounting head 10 is controlled by the controller 23 so that the mounting head 10 moves along the X direction to a position above the table arrangement 6. For each of the electronic parts 150, the controller 23 controls the position of the mounting head 10 above the table arrangement 6 in response to the calculated positional error. Then, the sucking nozzles 20 on the mounting head 10 are controlled by the controller 23 so that the sucking nozzles 20 move downward by distances depending on the detected heights of the electronic parts 150. The sucking nozzles 20 on the mounting head place or mount the electronic parts 150 on the printed circuit board 19. While the mounting head 10 implements the electronic-parts mounting process, the mounting head 11 is controlled by the controller 23 so that the mounting head 11 is moved along the X direction to a predetermined position related to the cassettes 4 in the electronic-parts feeder 3. The feeding device 22 actuates levers (not shown) of the cassettes 4 and hence opens shutters thereof. The mounting head 11 is controlled by the controller 23 so that the sucking nozzles 20 thereon move downward and access electronic parts 150 in the cassettes 4 via the opened shutters. The sucking nozzles 20 on the mounting head 11 pick up the electronic parts 150, and then move upward.

Figure 25:
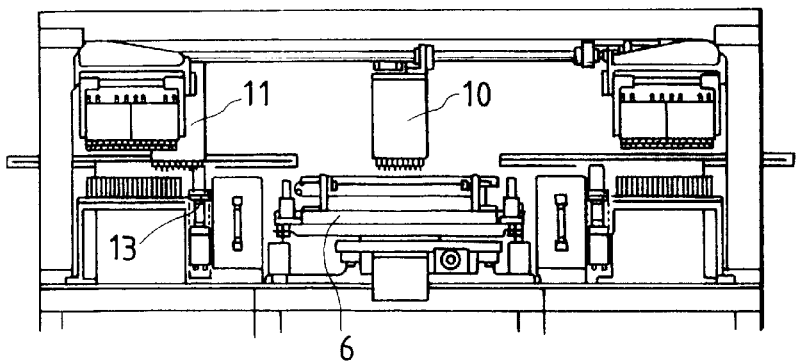

Subsequently, as shown in FIG. 25, the mounting head 11 is controlled by the controller 23 so that the mounting head 11 moves along the X direction to the electronic-parts recognizing section 13. It should be noted that the sucking nozzles 20 on the mounting head 11 hold the electronic parts 150. The electronic-parts recognizing section 13 detects conditions of the electronic parts 150 held by the sucking nozzles 20 on the mounting head 11. The detected conditions of the electronic parts 150 include heights and postures of the electronic parts 150. The electronic-parts recognizing section 13 informs the controller 23 of the detected conditions of the electronic parts 150 held by the sucking nozzles on the mounting head 11. The controller 23 calculates an error between a predetermined reference position and the detected position of each of the electronic parts 150. The controller 23 stores data representative of the calculated positional error in the internal RAM.

A sequence of these processes is periodically reiterated so that the electronic parts 150 are successively mounted on the printed circuit board 19 by the mounting heads 10 and 11. The mounting heads 10 and 11 alternately implement the electronic-parts mounting processes.

As previously indicated, electronic components 150 unacceptably held by the sucking nozzles 20 on the mounting heads and 11 are removed from normal feed paths via the defective-parts removing sections 17 and 18. The defective-parts removing processes related to the defective-parts removing sections 17 and 18 are similar to each other. Therefore, only the defective-parts removing process related to the defective-parts removing section 17 will be explained hereinafter.

Figure 26:
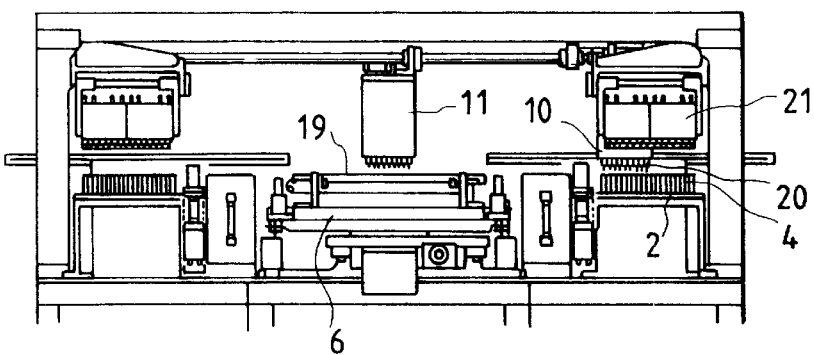
FIGS. 26, 27, 28, and 29 are front views of the electronic-parts mounting apparatus in FIG. 1 which are in different states respectively.

As shown in FIG. 26, while the mounting head 11 places electronic parts 150 on a printed circuit board 19 on the table arrangement 6, the mounting head 10 is controlled by the controller 23 so that the mounting head 10 is moved along the X direction to the predetermined position related to the cassettes 4 in the electronic-parts feeder 2. The feeding device 21 actuates the levers of the cassettes 4, and hence opens the shutters thereof. The mounting head 10 is controlled by the controller 23 so that the sucking nozzles 20 thereon move downward and access electronic parts 150 in the cassettes 4 via the opened shutters. The sucking nozzles 20 on the mounting head 10 pick up the electronic parts 150, and then move upward.

Figure 27:
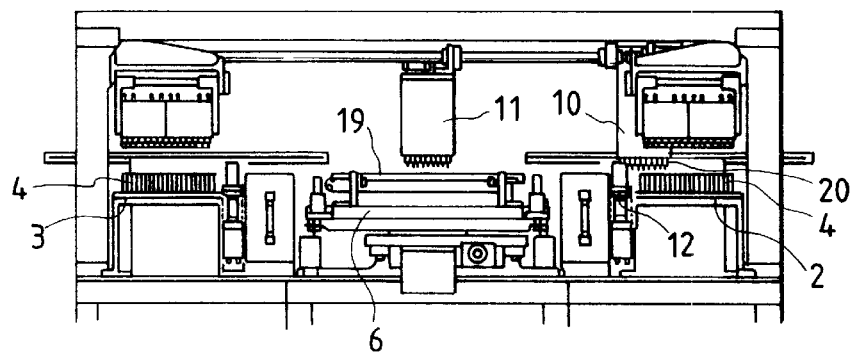

Subsequently, as shown in FIG. 27, the mounting head 10 is controlled by the controller 23 so that the mounting head 10 moves along the X direction to the electronic-parts recognizing section 12. It should be noted that the sucking nozzles 20 on the mounting head hold the electronic parts 150. The electronic-parts recognizing section 12 detects conditions of the electronic parts 150 held by the sucking nozzles 20 on the mounting head 10. The detected conditions of the electronic parts 150 include heights and postures of the electronic parts 150. The electronic-parts recognizing section 12 informs the controller 23 of the detected conditions of the electronic parts 150 held by the sucking nozzles on the mounting head 10. The controller 23 decides whether or not the sucking nozzles 20 on the mounting head 10 fail to hold the electronic parts 150 in response to the detected conditions of the electronic parts 150. When it is decided that the sucking nozzles on the mounting head 10 fail to hold the electronic parts 150, the mounting head 10 is controlled by the controller 23 so that the mounting head 10 returns from the electronic-parts recognizing section 12 to the predetermined position related to the cassettes 4 in the electronic-parts feeder 2. Then, the mounting head 10 is controlled by the controller 23 so that the mounting head 10 repeats a process of picking up electronic components 150 from the cassettes 4 in the electronic-parts feeder 2. Subsequently, the mounting head 10 is controlled by the controller 23 so that the mounting head 10 moves to the electronic-parts recognizing section 12 again. The electronic-parts recognizing section 12 detects conditions of the electronic parts 150 held by the sucking nozzles on the mounting head 10. As long as the sucking nozzles 20 on the mounting head 10 fail to hold the electronic parts 150, a sequence of these processes is periodically repeated and the controller 23 counts the number of the repetition. When the number of the repetition reaches a predetermined number, the controller 23 indicates a message on its display. The message means that electronic parts 150 have been exhausted.

Figure 28:
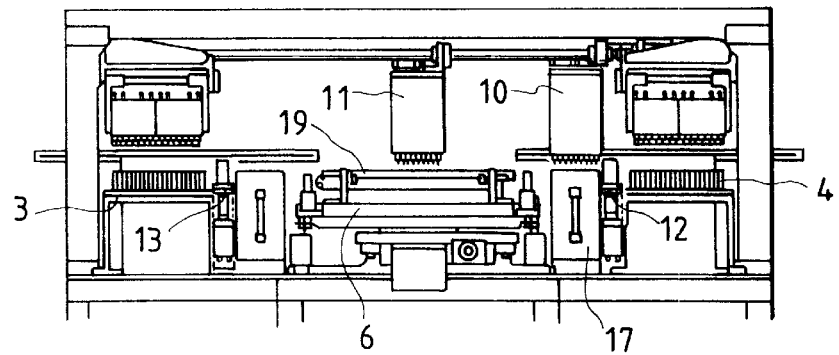
Figure 29:
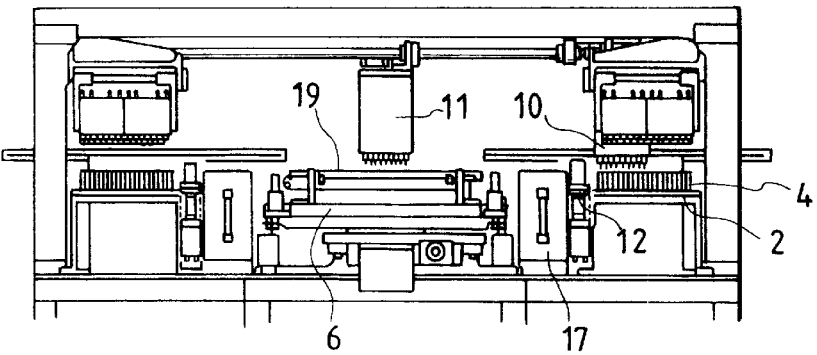

The controller 23 decides whether or not each of the electronic parts 150 is normally held by the related sucking nozzle on the mounting head 10 in response to the detected conditions of the electronic parts 150. When it is decided that at least one of the electronic parts 150 is not normally held by the related sucking nozzle 20 on the mounting head 10, the mounting head 10 is controlled by the controller 23 so that the mounting head 10 moves to the defective-parts removing section 17 as shown in FIG. 28. Then, the mounting head 10 is controlled by the controller 23 so that the mounting head 10 discharges the abnormally-held electronic parts 150 to the defective-parts removing section 17. Subsequently, the mounting head 10 is controlled by the controller 23 so that the mounting head 10 returns to the predetermined position related to the cassettes 4 in the electronic-parts feeder 2 as shown in FIG. 29. In addition, the mounting head 10 is controlled by the controller 23 so that the unloaded sucking nozzle or nozzles on the mounting head 10 repeat a process of picking up electronic parts 150 from the cassettes 4 in the electronic-parts feeder 2. Then, the mounting head 10 is controlled by the controller 23 so that the mounting head 10 moves to the electronic-parts recognizing section 12 again. The electronic-parts recognizing section 12 detects conditions of the electronic parts 150 held by the sucking nozzles 20 on the mounting head 10.

Figure 30:
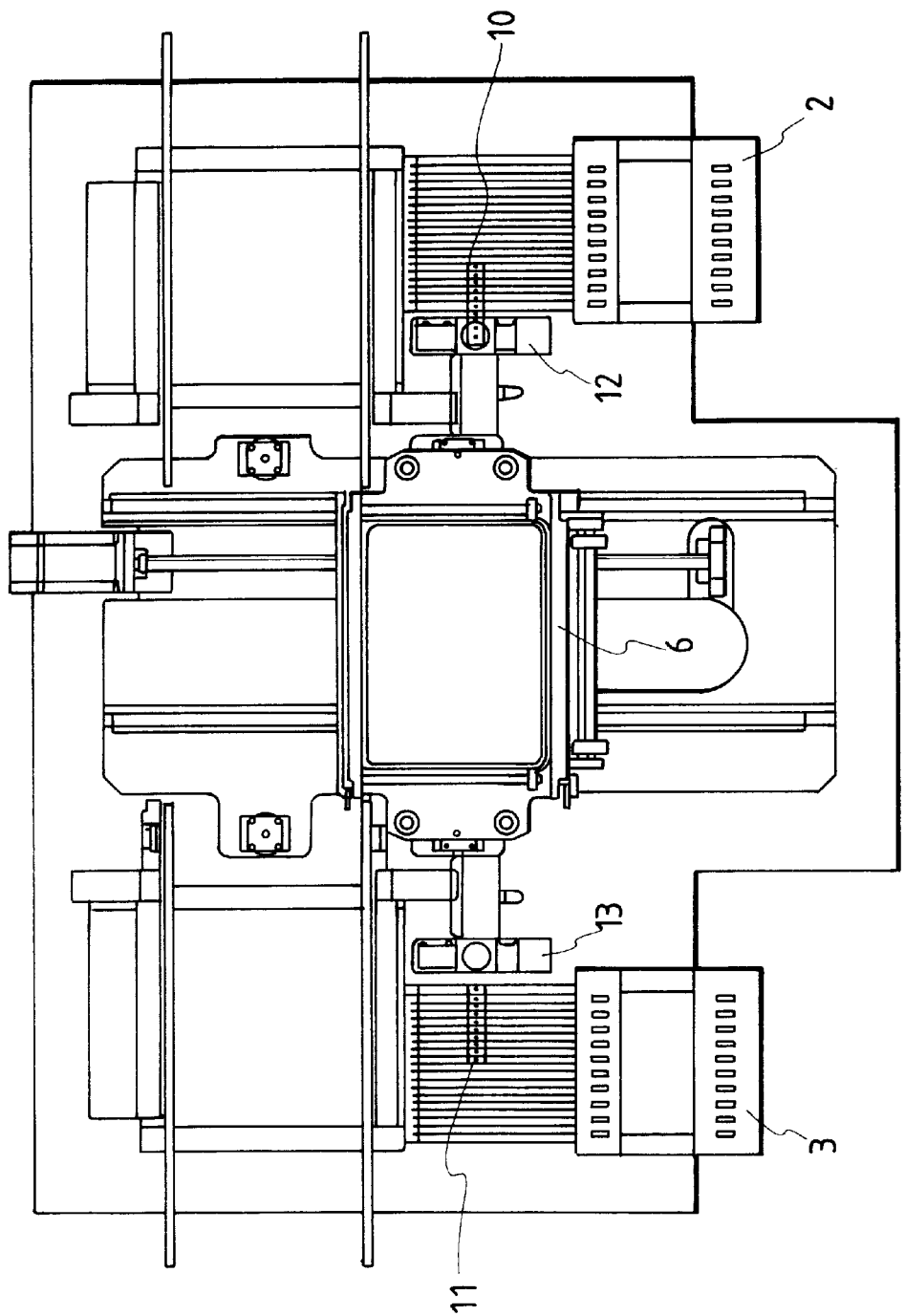
FIG. 30 is a top view of the electronic-parts mounting apparatus in FIG. 1 which is in a state different from the state shown in FIG. 3.
Figure 31:
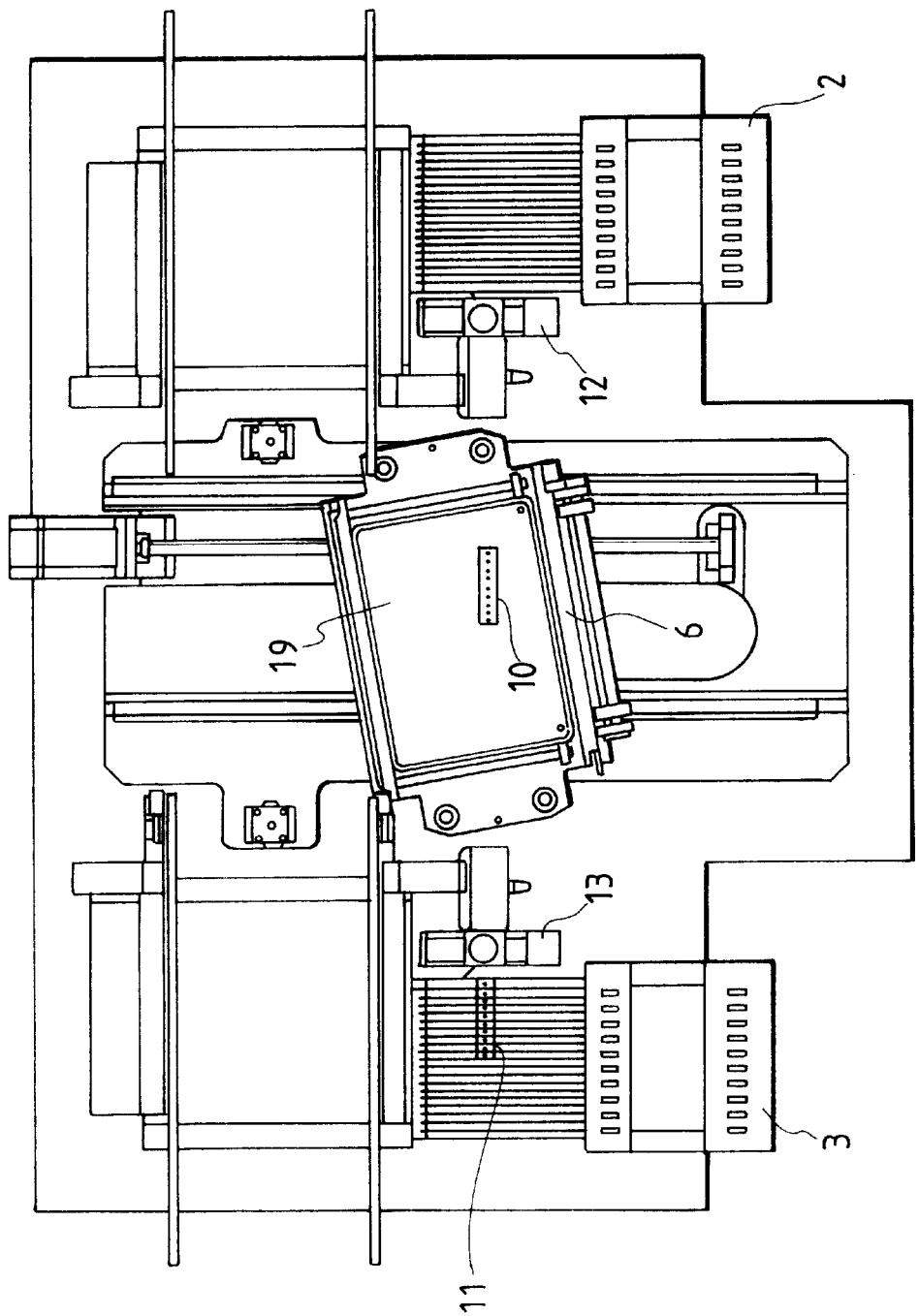
FIG. 31 is a top view of the electronic-parts mounting apparatus in FIG. 1 which is in a state different from the state shown in FIG. 3.

During the electronic-parts mounting process, the relative position between each of electronic parts 150 on the mounting head and a printed circuit board 19 on the table arrangement 6 is finely controlled or adjusted as follows. With reference to FIG. 30, the electronic-parts recognizing section 12 detects conditions of electronic parts 150 held by the sucking nozzles 20 on the mounting head 10. The detected conditions of the electronic parts 150 include heights and postures of the electronic parts 150. The electronic-parts recognizing section 12 informs the controller 23 of the detected conditions of the electronic parts 150 held by the sucking nozzles 20 on the mounting head 10. The controller 23 calculates an error between a predetermined reference position and the detected position of each of the electronic parts 150. The calculated positional error has components related to the X direction, the Y direction, and the θ direction, respectively. The controller 23 stores data representative of the calculated positional error in the internal RAM. As shown in FIG. 31, the mounting head is controlled by the controller 23 so that the mounting head 10 moves to a position above the table arrangement 6. For each of the electronic parts 150, the controller 23 finely controls the position of the mounting head 10 above the table arrangement 6 in response to the X-direction component of the calculated positional error. In addition, the controller 23 finely controls the position of the Y table 29 of the table arrangement 6 in response to the Y-direction component of the calculated positional error. Furthermore, the controller 23 finely controls the position of the θ frame 34 of the table arrangement 6 in response to the θ-direction component of the calculated positional error. As a result, the positional error of each of the electronic parts 150 held by the sucking nozzles 20 on the mounting head 10 is corrected. Similarly, a positional error of each of electronic parts 150 held by the sucking nozzles 20 on the mounting head 11 is corrected.

Second Embodiment

A second embodiment of this invention is similar to the first embodiment thereof except for design changes indicated hereinafter.

Figure 32:
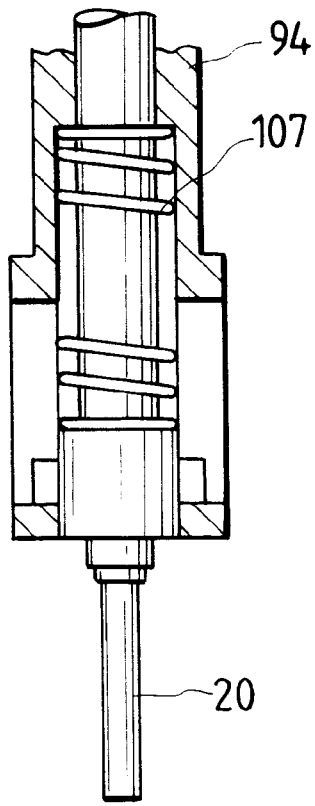
FIG. 32 is a sectional view of a sucking nozzle and a sliding shaft in a mounting head in an electronic-parts mounting apparatus according to a second embodiment of this invention.

With reference to FIG. 32, the second embodiment of this invention includes a sucking nozzle 20 which is movably connected to a sliding shaft 94. Normally, the sucking nozzle 20 moves together with the sliding shaft 94. The sucking nozzle 20 can move axially or vertically relative to the sliding shaft 94. A compression spring 107 disposed in a space in the sliding shaft 94 urges the sucking nozzle 20 downward relative to the sliding shaft 94.

Figure 33:
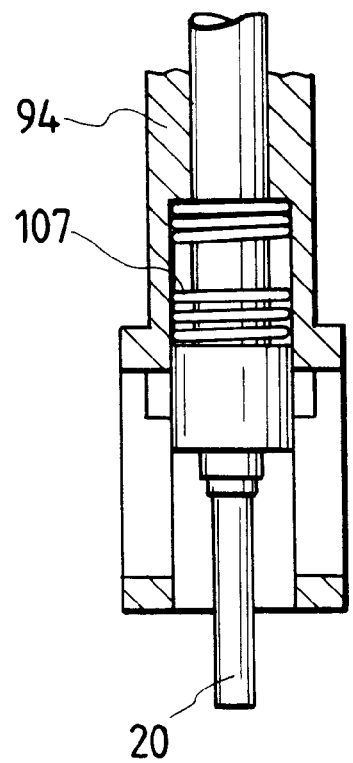
FIG. 33 is a view similar to FIG. 32, showing the sucking nozzle and the sliding shaft in a state different from the state shown in FIG. 32.

As shown in FIG. 33, the sucking nozzle 20 can move relative to the sliding shaft 94 against the force of the compression spring 107. This design is advantageous in absorbing a shock when the sucking nozzle 20 meets an electronic component 150.

Figure 34:
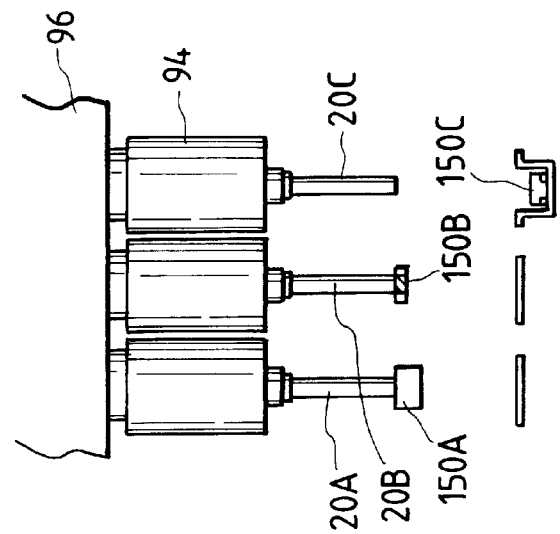
FIGS. 34, 35, 36, 37, and 38 are diagrammatic views of the mounting head and electronic parts in the second embodiment of this invention which are in different states respectively.

As shown in FIG. 34, the upper surfaces of electronic components (electronic parts) 150A, 150B, and 150C of different types are in different height positions. Specifically, the upper surface of the electronic component 150A is in the highest position. The upper surface of the electronic component 150B is in the second highest position. The upper surface of the electronic component 150C is in the lowest position.

The controller 23 (see FIG. 1) separates the electronic components 150A, 150B, and 150C into a group or groups according to the height positions thereof. A difference between the height positions of the upper surfaces of the electronic components in each group corresponds to less than the possible vertical displacement of the sucking nozzles 20A, 20B, and 20C relative to the sliding shafts 94. The electronic components 150A and 150B are in a first group while the electronic component 150C is in a second group.

Figure 35:
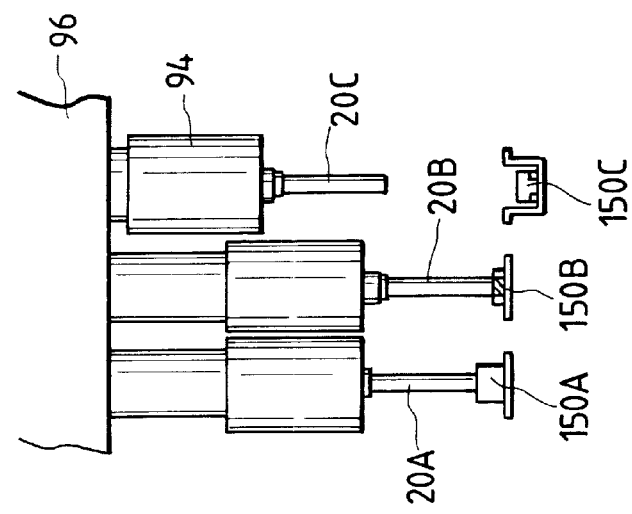
Figure 36:
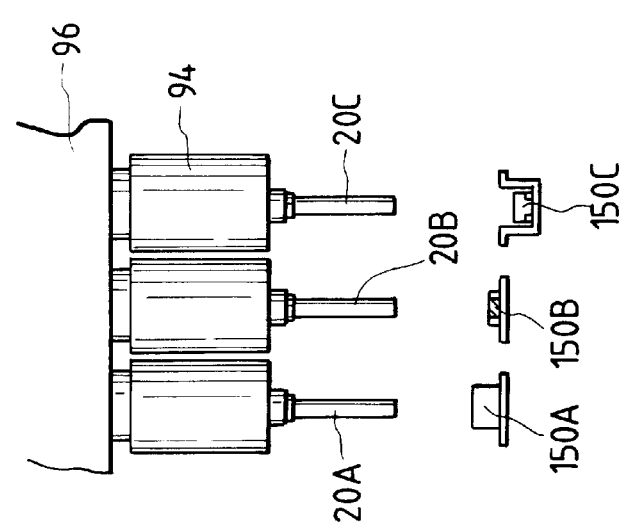

Firstly, the controller 23 (see FIG. 1) sets the lower limit position of the sucking nozzles 20A and 20B in accordance with the lowest position among the height positions of the upper surfaces of the electronic components 150A and 150B in the first group. Specifically, the lower limit position of the sucking nozzles 20A and 20B is set in accordance with the height position of the upper surface of the electronic component 150B. The controller 23 (see FIG. 1) controls the sliding shafts 94 so that the sucking nozzles 20A and 20B related to the electronic components 150A and 150B in the first group move downward while the sucking nozzle 20C related to the electronic component 150C remains at its uppermost position as shown in FIG. 35. The sucking nozzle 20A meets the electronic component 150A before the sucking nozzle 20B reaches the lower limit position. When the sucking nozzle 20A meets the electronic component 150A, the sucking nozzle 20A starts to move relative to the related sliding shaft 94 against the force of the spring 107. Thus, a shock on the sucking nozzle 20A can be absorbed. Then, as shown in FIG. 36, the sucking nozzles 20A and 20B pick up the electronic components 150A and 150B respectively. The controller 23 (see FIG. 1) controls the sliding shafts 94 so that the sucking nozzles 20A and 20B with the electronic components 150A and 150B move upward to the upper limit position.

Figure 38:
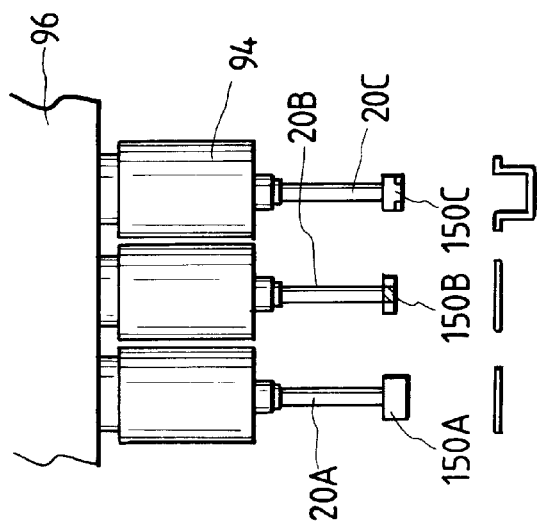
Figure 37:
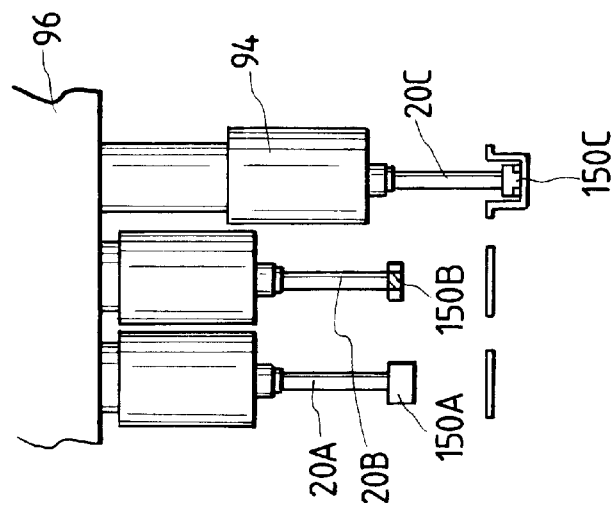

Subsequently, the controller 23 (see FIG. 1) sets the lower limit position of the sucking nozzle 20C in accordance with the height position of the upper surface of the electronic component 150C. The controller 23 (see FIG. 1) controls the sliding shaft 94 related to the sucking nozzle 20C so that the sucking nozzle 20C moves downward to the lower limit position as shown in FIG. 37. Then, as shown in FIG. 38, the sucking nozzle 20C picks up the electronic component 150C. The controller 23 (see FIG. 1) controls the sliding shaft 94 so that the sucking nozzle 20C with the electronic component 150C moves upward to the upper limit position. In this way, the electronic components 150A, 150B, and 150C are picked up and held by the sucking nozzles 20A, 20B, and 20C respectively.

Third Embodiment

A third embodiment of this invention is similar to the second embodiment thereof except for design changes indicated later.

Figure 39:
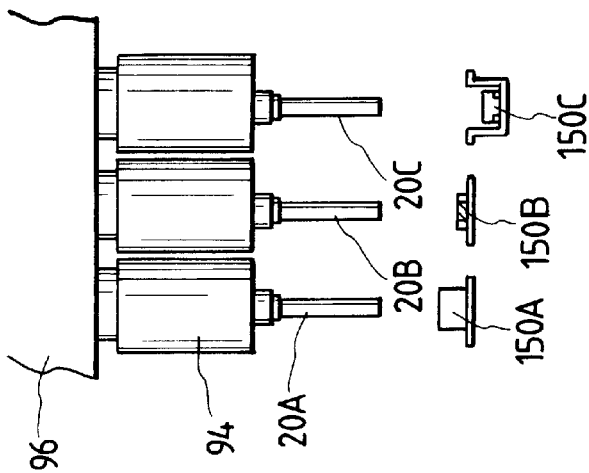

As shown in FIG. 39, the upper surfaces of electronic components (electronic parts) 150A, 150B, and 150C of different types are in different height positions. Specifically, the upper surface of the electronic component 150A is in the highest position. The upper surface of the electronic component 150B is in the second highest position. The upper surface of the electronic component 150C is in the lowest position.

The controller 23 (see FIG. 1) separates the electronic components 150A, 150B, and 150C into a group or groups according to the height positions thereof. It is preferable that a difference between the height positions of the upper surfaces of the electronic components in each group corresponds to less than the possible vertical displacement of the sucking nozzles 20A, 20B, and 20C relative to the sliding shafts 94. The electronic components 150A and 150B are in a first group while the electronic component 150C is in a second group.

Firstly, the controller 23 (see FIG. 1) sets the lower limit position of the sucking nozzles 20A and 20B in accordance with the lowest position among the height positions of the upper surfaces of the electronic components 150A and 150B in the first group. Specifically, the lower limit position of the sucking nozzles 20A and 20B is set in accordance with the height position of the upper surface of the electronic component 150B. The controller 23 (see FIG. 1) controls the sliding shafts 94 so that all the sucking nozzles 20A, 20B, and 20C related to the electronic components 150A, 150B, and 150C move downward as shown in FIG. 40. The sucking nozzle 20A meets the electronic component 150A before the sucking nozzle 20B reaches the lower limit position. When the sucking nozzle 20A meets the electronic component 150A, the sucking nozzle 20A starts to move relative to the related sliding shaft 94 against the force of the spring 107. Thus, a shock on the sucking nozzle 20A can be absorbed. The sucking nozzle 20C remains out of contact with the electronic component 150C although the sucking nozzle 20C moves downward to the lower limit position.

Subsequently, the controller 23 (see FIG. 1) sets the lower limit position of the sucking nozzle 20C in accordance with the height position of the upper surface of the electronic component 150C. The controller 23 (see FIG. 1) controls the sliding shafts 94 related to the sucking nozzles 20A, 20B, and 20C so that the sucking nozzle 20C moves downward to the lower limit position while the sucking nozzles 20A and 20B remain in contact with the electronic components 150A and 150B as shown in FIG. 41. During this period, the sucking nozzles 20A and 20B move relative to the related sliding shafts 94 against the forces of the springs 107 while remaining in contact with the electronic components 150A and 150B. Then, as shown in FIG. 42, the sucking nozzles 20A, 20B, and 20C pick up the electronic components 150A, 150B, and 150C.

The controller 23 (see FIG. 1) controls the sliding shafts 94 so that the sucking nozzles 20A, 20B, and 20C with the electronic components 150A, 150B, and 150C move upward to the upper limit position. In this way, the electronic components 150A, 150B, and 150C are picked up and held by the sucking nozzles 20A, 20B, and 20C respectively.

What is claimed is:

1. An electronic-parts mounting apparatus comprising:

cassettes containing electronic parts;

first and second feeders for feeding the electronic parts from the cassettes;

a first mounting head having sucking nozzles for picking up the electronic parts fed by the first feeder;

a second mounting head having sucking nozzles for picking up the electronic parts fed by the second feeder;

a table arrangement for holding a printed circuit board;

first means for alternately moving the first and second mounting heads along a first direction to a position adjacent to the printed circuit board on the table arrangement;

second means contained in the table arrangement for moving the printed circuit board on the table arrangement in a second direction perpendicular to the first direction;

third means contained in the table arrangement for rotating the printed circuit board on the table arrangement about an axis perpendicular to both the first and second directions;

fourth means for allowing the sucking nozzles of the first mounting head to place the electronic parts on the printed circuit board on the table arrangement when the first mounting head is in the region;

fifth means for allowing the sucking nozzles of the second mounting head to place the electronic parts on the printed circuit board on the table arrangement when the second mounting head is in the region;

sixth means for detecting whether or not each of the electronic parts is normally held by the related sucking nozzle of the first mounting head;

seventh means for removing the electronic parts from the related sucking nozzles which are detected by the sixth means to be not normally held by the related sucking nozzles;

eighth means for detecting whether or not each of the electronic parts is normally held by the related sucking nozzle of the second mounting head; and ninth means for removing the electronic parts from the related sucking nozzles which are detected by the eighth means to be not normally held by the related sucking nozzles.

2. The electronic-parts mounting apparatus as recited in claim 1, further comprising:

tenth means for detecting whether or not the sucking nozzles of the first mounting head fail to pick up the electronic parts, for detecting postures of the electronic parts held by the sucking nozzles of the first mounting head, and for detecting heights of the electronic parts held by the sucking nozzles of the first mounting head; and eleventh means for detecting whether or not the sucking nozzles of the second mounting head fail to pick up the electronic parts, for detecting postures of the electronic parts held by the sucking nozzles of the second mounting head, and for detecting heights of the electronic parts held by the sucking nozzles of the second mounting head.

3. The electronic-parts mounting apparatus as recited in claim 1, wherein the table arrangement comprises a motor, a speed-reduction device connected to an output shaft of the motor, a table connected to the speed-reduction device and rotating as the output shaft of the motor rotates, and a holding member connected to the table for holding the printed circuit board.

4. The electronic-parts mounting apparatus as recited in claim 3, wherein the table arrangement further comprises means for carrying the printed circuit board to and from the holding member, and means for locating the printed circuit board on the holding member.

5. The electronic-parts mounting apparatus as recited in claim 4, further comprising a motor, and a power transmission mechanism connected between the motor and the locating means in the table arrangement.

6. The electronic-parts mounting apparatus as recited in claim 1, further comprising a printed-circuit-board feeder for feeding the printed circuit board to the table arrangement, and a printed-circuit-board carrier for carrying the printed circuit from the table arrangement.

7. The electronic-parts mounting apparatus as recited in claim 6, wherein the printed-circuit-board feeder comprises guide members for guiding opposite sides of the printed circuit board, respectively.

8. The electronic-parts mounting apparatus as recited in claim 6, further comprising a stopper for stopping the printed circuit board at a predetermined position above the table arrangement which is fed by the printed-circuit-board feeder.

9. The electronic-parts mounting apparatus as recited in claim 6, further comprising a motor, and a power transmission mechanism connected between the motor and the printed-circuit-board feeder.

10. The electronic-parts mounting apparatus as recited in claim 1, wherein the cassettes comprise a bulk-type cassette containing electronic parts in bulk, and a taping-type cassette containing chip-type electronic parts attached to a tape at given intervals.

11. The electronic-parts mounting apparatus as recited in claim 1, wherein the sucking nozzles of the second mounting head places the electronic parts on the printed circuit board on the table arrangement while the sucking nozzles of the first mounting head pick up the electronic parts fed by the first feeder, and wherein the sucking nozzles of the first mounting head places the electronic parts on the printed circuit board on the table arrangement while the sucking nozzles of the second mounting head pick up the electronic parts fed by the second feeder.

12. The electronic-parts mounting apparatus as recited in claim 1, wherein the sucking nozzles of the first and second mounting heads are arranged at a pitch corresponding to a pitch between paths of feed of electronic parts from the cassettes.

13. The electronic-parts mounting apparatus as recited in claim 1, wherein each of the first and second mounting heads comprises a motor, a cam member connected to an output shaft of the motor, a cam follower engaging the cam member, a plate connected to the cam follower and holding the sucking nozzles, the sucking nozzles being elevated and lowered as the output shaft of the motor rotates.

14. The electronic-parts mounting apparatus as recited in claim 13, further comprising means for varying lower limit positions of the sucking nozzles by controlling a range of rotation of the output shaft of the motor with respect to the cam member.

15. The electronic-parts mounting apparatus as recited in claim 13, wherein a speed of movement of the sucking nozzles is low when the sucking nozzles are positionally close to their upper limit positions and their lower limit positions.

16. The electronic-parts mounting apparatus as recited in claim 13, further comprising means for controlling a speed of rotation of the output shaft of the motor.

17. The electronic-parts mounting apparatus as recited in claim 13, further comprising springs connected to the sucking nozzles of the first and second mounting heads for urging the sucking nozzles downward.

18. The electronic-parts mounting apparatus as recited in claim 1, further comprising means for simultaneously elevating and lowering the sucking nozzles of the first mounting head, and means for simultaneously elevating and lowering the sucking nozzles of the second mounting heads.

19. The electronic-parts mounting apparatus as recited in claim 1, further comprising means for sequentially elevating and lowering the sucking nozzles of the first mounting head at different timings, and means for sequentially elevating and lowering the sucking nozzles of the second mounting heads at different timings.

20. The electronic-parts mounting apparatus as recited in claim 1, further comprising:

tenth means for selecting at least one sucking nozzle from among the sucking nozzles of the first mounting head;

eleventh means for elevating and lowering the selected sucking nozzle of the first mounting head;

twelfth means for selecting at least one sucking nozzle from among the sucking nozzles of the second mounting head; and thirteenth means for elevating and lowering the selected sucking nozzle of the second mounting head.

21. The electronic-parts mounting apparatus as recited in claim 20, further comprising:

fourteenth means for inhibiting sucking nozzles of the first mounting head which are not selected by the tenth means from being elevated and lowered by the eleventh means; and fifteenth means for inhibiting sucking nozzles of the second mounting head which are not selected by the twelfth means from being elevated and lowered by the thirteenth means.

* * * * *